US011610878B1

(12) United States Patent
Lo

(10) Patent No.: US 11,610,878 B1
(45) Date of Patent: Mar. 21, 2023

(54) SEMICONDUCTOR DEVICE WITH STACKED CHIPS AND METHOD FOR FABRICATING THE SAME

(71) Applicant: NANYA TECHNOLOGY CORPORATION, New Taipei (TW)

(72) Inventor: Yi-Jen Lo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 69 days.

(21) Appl. No.: 17/465,279

(22) Filed: Sep. 2, 2021

(51) Int. Cl.
*H01L 25/065* (2006.01)
*H01L 25/00* (2006.01)
*H01L 25/18* (2023.01)
*H01L 23/00* (2006.01)

(52) U.S. Cl.
CPC .............. *H01L 25/50* (2013.01); *H01L 24/08* (2013.01); *H01L 24/80* (2013.01); *H01L 25/0652* (2013.01); *H01L 25/18* (2013.01); *H01L 2224/08145* (2013.01); *H01L 2224/80895* (2013.01); *H01L 2224/80896* (2013.01); *H01L 2225/06541* (2013.01); *H01L 2924/1431* (2013.01); *H01L 2924/1434* (2013.01)

(58) Field of Classification Search
CPC ......... H01L 25/50; H01L 24/08; H01L 24/80; H01L 25/0652; H01L 25/18; H01L 2224/08145; H01L 2224/80895; H01L 2224/80896; H01L 2225/06541; H01L 2924/1434
See application file for complete search history.

(56) References Cited

U.S. PATENT DOCUMENTS

2022/0139882 A1* 5/2022 Chen ................... H01L 25/0657
257/686
2022/0310470 A1* 9/2022 Chen ................... H01L 23/4334

FOREIGN PATENT DOCUMENTS

| TW | 202109790 A | 3/2021 |
| TW | 202113997 A | 4/2021 |
| TW | 202114089 A | 4/2021 |
| TW | 202133285 A | 9/2021 |

* cited by examiner

*Primary Examiner* — Thanh Y. Tran
(74) *Attorney, Agent, or Firm* — Muncy, Geissler, Olds & Lowe, P.C.

(57) ABSTRACT

The present application discloses a semiconductor device and a method for fabricating the semiconductor device. The method includes providing a bottom substrate; bonding a first stacking chip and a second stacking chip onto the bottom substrate; conformally forming a first isolation layer to cover the first and second stacking chips and to at least partially fill a gap between the first and second stacking chips; performing a thinning process to expose back surfaces of the first and second stacking chips; performing a removal process to expose through substrate vias of the first and second stacking chips; forming a first capping layer to cover the through substrate vias of the first and second stacking chips; and performing a planarization process to expose the through substrate vias of the first and second stacking chips and provide a substantially flat surface.

20 Claims, 29 Drawing Sheets

1

SEMICONDUCTOR DEVICE WITH STACKED CHIPS AND METHOD FOR FABRICATING THE SAME

TECHNICAL FIELD

The present disclosure relates to a semiconductor device and a method for fabricating the semiconductor device, and more particularly, to a semiconductor device with stacked chips and the method for fabricating the semiconductor device with stacked chips.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for fabricating a semiconductor device including providing a bottom substrate; bonding a first stacking chip and a second stacking chip onto the bottom substrate; conformally forming a first isolation layer to cover the first stacking chip and the second stacking chip and to at least partially fill a gap between the first stacking chip and the second stacking chip; performing a thinning process to expose back surfaces of the first stacking chip and the second stacking chip; performing a removal process to expose a through substrate via of the first stacking chip and a through substrate via of the second stacking chip; forming a first capping layer to cover the through substrate via of the first stacking chip and the through substrate via of the second stacking chip; and performing a planarization process to expose the through substrate via of the first stacking chip and a through substrate via of the second stacking chip and provide a substantially flat surface.

In some embodiments, the removal process is a dry etch process.

In some embodiments, an etch rate ratio of the first isolation layer to a substrate of the first stacking chip is between about 15:1 and about 2:1 of the dry etch process.

In some embodiments, the method for fabricating the semiconductor device includes bonding a third stacking chip onto the first stacking chip and bonding a fourth stacking chip onto the second stacking chip.

In some embodiments, the first stacking chip and the second stacking chip are bonded onto the bottom substrate by a hybrid bonding process.

In some embodiments, a process pressure of the hybrid bonding process is between about 100 MPa and about 150 MPa.

In some embodiments, a process temperature of the hybrid bonding process is between about 25° C. and about 400° C.

In some embodiments, the method for fabricating the semiconductor device includes a thermal annealing process after bonding the first stacking chip and the second stacking chip onto the bottom substrate.

In some embodiments, the first isolation layer comprises an oxide layer, a nitride layer, or an oxynitride layer.

In some embodiments, the first capping layer comprises an oxide layer, a nitride layer, or an oxynitride layer.

In some embodiments, the first stacking chip and the second stacking chip comprise memory circuits.

In some embodiments, the first stacking chip comprises logic circuits and the third stacking chip comprises memory circuits.

Another aspect of the present disclosure provides a semiconductor device including a bottom substrate; a first stacking chip and a second stacking chip positioned on the bottom substrate; a first isolation layer positioned on the bottom substrate and surrounding the first stacking chip and the second stacking chip; a first capping layer positioned on the back surface of the first stacking chip and surrounding a through substrate via of the first stacking chip. A top surface of the first isolation layer is at a vertical level higher than a vertical level of a back surface of the first stacking chip. A top surface of the through substrate via of the first stacking chip, the top surface of the first isolation layer, and a top surface of the first capping layer are substantially coplanar.

In some embodiments, a thickness of the first stacking chip is equal to or less than about 10 nm.

In some embodiments, the semiconductor device includes a third stacking chip positioned on the first stacking chip and a fourth stacking chip positioned on the second stacking chip.

In some embodiments, the first stacking chip and the third stacking chip comprise memory circuits.

In some embodiments, the first stacking chip comprises logic circuits and the third stacking chip comprises memory circuits.

In some embodiments, the semiconductor device includes a plurality of connectors positioned on back surfaces of the third stacking chip and the fourth stacking chip.

In some embodiments, the semiconductor device includes a redistribution layer positioned in the bottom substrate. The first stacking chip and the second stacking chip are respectively electrically coupled to the redistribution layer.

In some embodiments, a conductive pad of the first stacking chip directly contacts the redistribution layer.

Due to the design of the semiconductor device of the present disclosure, the thickness uniformity and the edge profile of the chips may be improved. As a result, the yield, quality, and performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
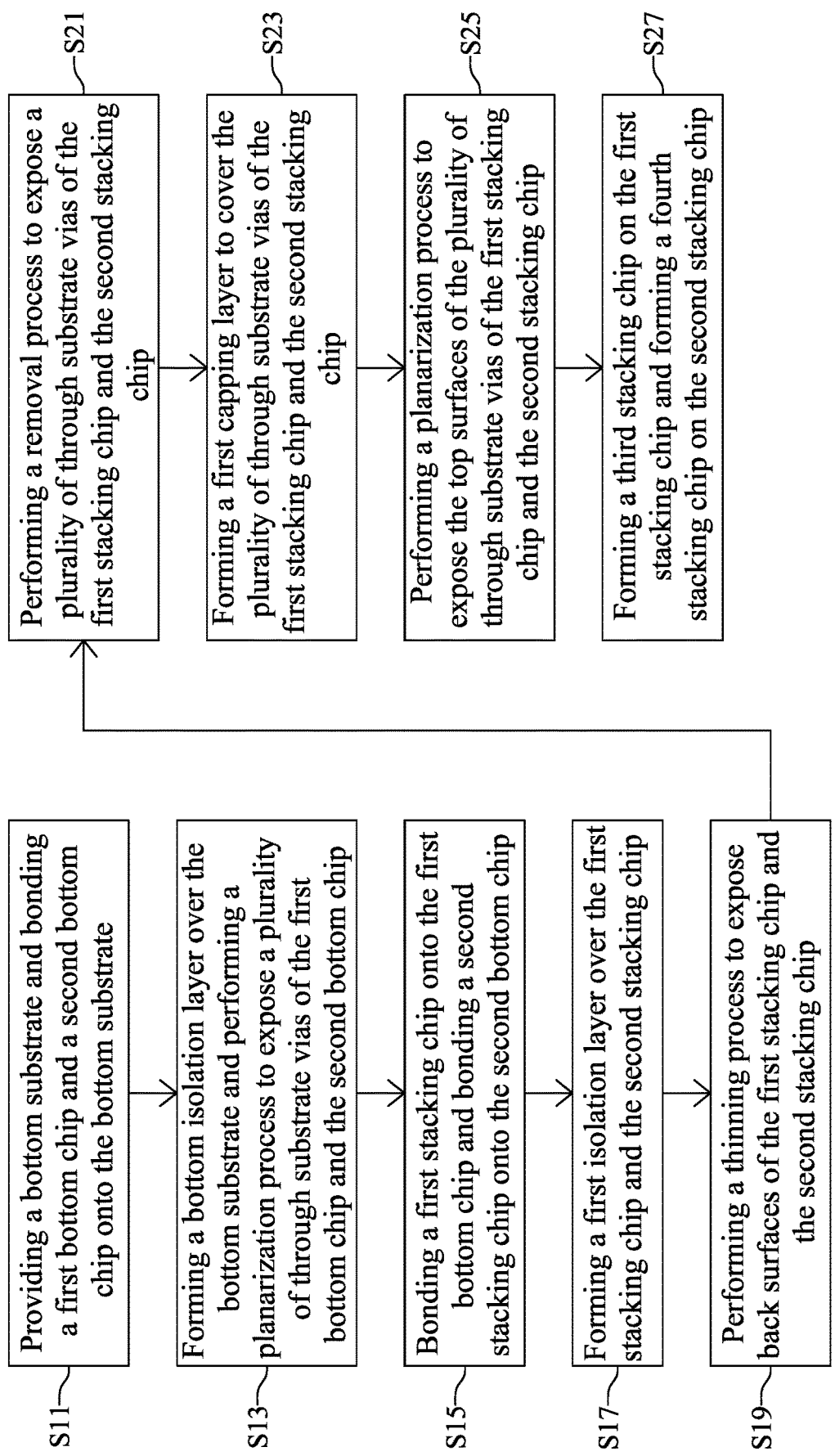
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 14 illustrate, in schematic cross-sectional view diagrams, a flow for fabricating the semiconductor device 1A in accordance with one embodiment of the present disclosure. FIG. 15 illustrates, in a schematic close-up cross-sectional view diagram, part of the semiconductor device 1A in accordance with one embodiment of the present disclosure.

Figure 2:
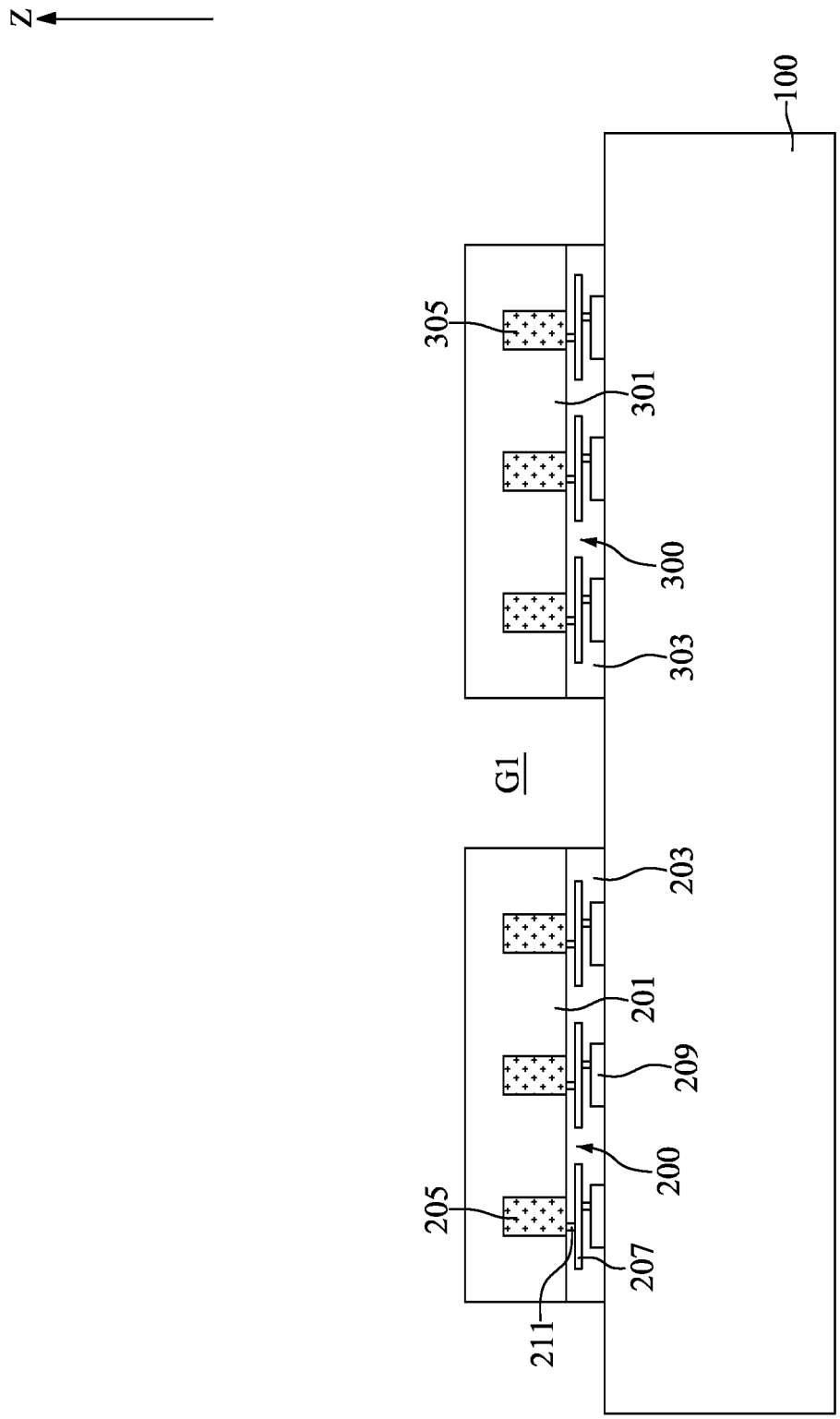
FIGS. 2 to 14 illustrate, in schematic cross-sectional view diagrams, a flow for fabricating the semiconductor device in accordance with one embodiment of the present disclosure.

With reference to FIGS. 1 and 2, at step S11, a bottom substrate 100 may be provided and a first bottom chip 200 and a second bottom chip 300 may be bonded onto the bottom substrate 100.

With reference to FIG. 2, the bottom substrate 100 may be a wafer, a chip, a package substrate, or an interposer. In some embodiments, the bottom substrate 100 may include logic circuits. In some embodiments, the bottom substrate 100 may include storage circuits such as control circuits or high-speed circuits. In some embodiments, the bottom substrate 100 may not include any functional units.

A functional unit, in the description of the present disclosure, generally refers to functionally related circuit that has been partitioned for functional purposes into a distinct unit. In some embodiments, functional units may be typically highly complex circuits such as processor cores, memory controllers, control circuits, high-speed circuits, or accelerator units. In some other embodiments, the complexity and functionality of a functional unit may be more or less complex.

With reference to FIG. 2, the first bottom chip 200 may include a substrate 201, an inter-dielectric layer 203, a plurality of through substrate vias 205, a plurality of device elements (not shown for clarity), and a plurality of conductive features.

With reference to FIG. 2, the inter-dielectric layer 203 may be bonded onto a front surface of the bottom substrate 100. In some embodiments, the inter-dielectric layer 203 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of device elements and the plurality of conductive features may be formed in the inter-dielectric layer 203 and electrically coupled to each other.

It should be noted that, in the description of the present disclosure, the term "front" surface is a term of art implying the major surface of the structure upon which is formed device elements and conductive features. Likewise, the "back" surface of a structure is that major surface opposite to the face.

In some embodiments, the device elements of the first bottom chip 200 may be transistors such as complementary metal-oxide-semiconductor transistors, metal-oxide-semiconductor field-effect transistors, fin field-effect-transistors, the like, or a combination thereof. The conductive features may include interconnect layers 207, conductive pads 209, and conductive vias 211. The interconnect layers 207 may be separated from each other and may be horizontally disposed in the inter-dielectric layer 203 along the direction Z. In the present embodiment, the bottommost interconnect layers 207 may be designated as the conductive pads 209. The conductive vias 211 may connect adjacent interconnect layers 207 along the direction Z, adjacent device element and interconnect layer 209, and adjacent conductive pad 209 and interconnect layer 207. In some embodiments, the conductive vias 211 may improve heat dissipation in the inter-dielectric layer 203 and may provide structure support in the inter-dielectric layer 203. The plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

The plurality of device elements, the plurality of conductive features may together configure functional units of the first bottom chip 200. In some embodiments, the functional units of the first bottom chip 200 may cooperate together and provide a logic functionality. In some embodiments, the functional units of the first bottom chip 200 may cooperate together and provide a memory functionality. In some embodiments, the functional units of the first bottom chip 200 may only include core storage circuit such as I/O and clocking circuit. The functional units of the first bottom chip 200 may not include any control circuit or high-speed circuit. The configuration of aforementioned elements of the first bottom chip 200 may be referred to as the layout of the first bottom chip 200.

With reference to FIG. 2, the substrate 201 may be formed on the inter-dielectric layer 203. The substrate 201 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

With reference to FIG. 2, the plurality of through substrate vias 205 may be formed in the substrate 201. The bottom surfaces of the plurality of through substrate vias 205 may be substantially coplanar with the interface between the substrate 201 and the inter-dielectric layer 203. The plurality of through substrate vias 205 may be electrically coupled to the plurality of device elements through the plurality of conductive features. In some embodiments, the configuration of the plurality of through substrate vias 205 may be also referred to as part of the layout of the first bottom chip 200.

With reference to FIG. 2, the second bottom chip 300 may be bonded onto the front surface of the bottom substrate 100. The second bottom chip 300 may be distant from the first bottom chip 200 with a first gap G1 interposed therebetween.

With reference to FIG. 2, the second bottom chip 300 may include a structure similar to the first bottom chip 200. For example, the second bottom chip 300 may include a substrate 301, an inter-dielectric layer 303, a plurality of through substrate vias 305, a plurality of device elements, and a plurality of conductive features. The same or similar name (or notation) of the second bottom chip 300 as the first bottom chip 200 may have same or similar structure and may be formed of same or similar material. Descriptions thereof are not repeated herein.

In some embodiments, the plurality of device elements, the plurality of conductive features may together configure functional units of the second bottom chip 300. In some embodiments, the functional units of the second bottom chip 300 may cooperate together and provide a logic functionality. In some embodiments, the functional units of the second bottom chip 300 may cooperate together and provide a memory functionality. In some embodiments, the functional units of the second bottom chip 300 may only include core storage circuit such as I/O and clocking circuit. The functional units of the second bottom chip 300 may not include any control circuit or high-speed circuit. The configuration of aforementioned elements of the second bottom chip 300 may be referred to as the layout of the second bottom chip 300. In some embodiments, the layout of the first bottom chip 200 and the layout of the second bottom chip 300 are the same. In some embodiments, the layout of the first bottom chip 200 and the layout of the second bottom chip 300 are different. For example, the layout of the first bottom chip 200 and the layout of the second bottom chip 300 are symmetrical to each other. For another example, the layout of the first bottom chip 200 may be reflection symmetrical with respect to the layout of the second bottom chip 300.

In some embodiments, the first bottom chip 200 and the second bottom chip 300 may be bonded onto the front surface of the bottom substrate 100 through a hybrid bonding process such as thermo-compression bonding, passivation-capping-layer assisted bonding, or surface activated bonding. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to short the time consuming of the hybrid bonding process. In some embodiments, the hybrid bonding process may include, for example, dielectric-to-dielectric bonding, metal-to-metal bonding, and metal-to-dielectric bonding. In some embodiments, a thermal annealing process may be performed after the bonding process to enhance dielectric-to-dielectric bonding and to induce thermal expansion of metal-to-metal bonding so as to further improve the bonding quality.

Figure 3:
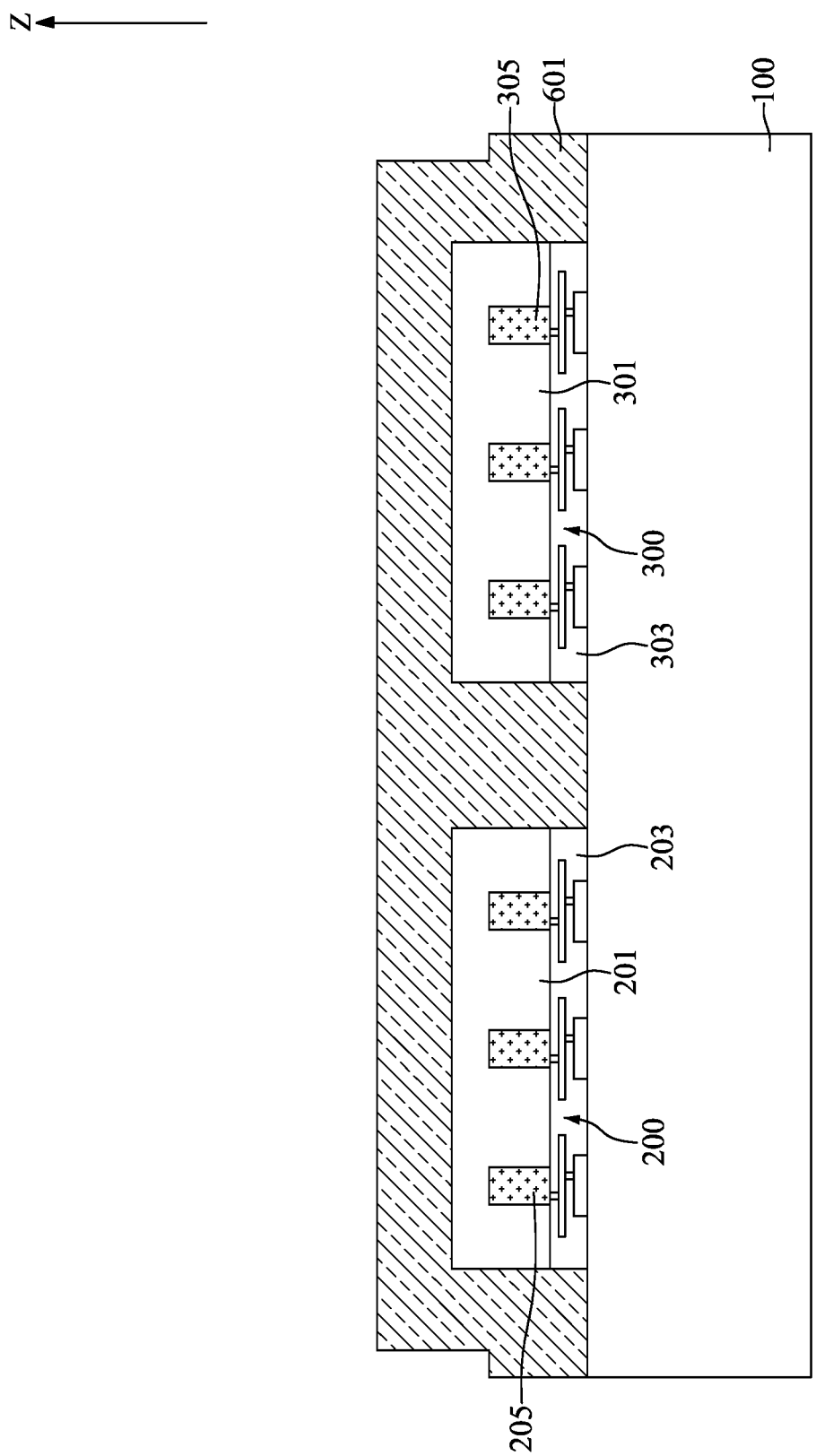
Figure 4:
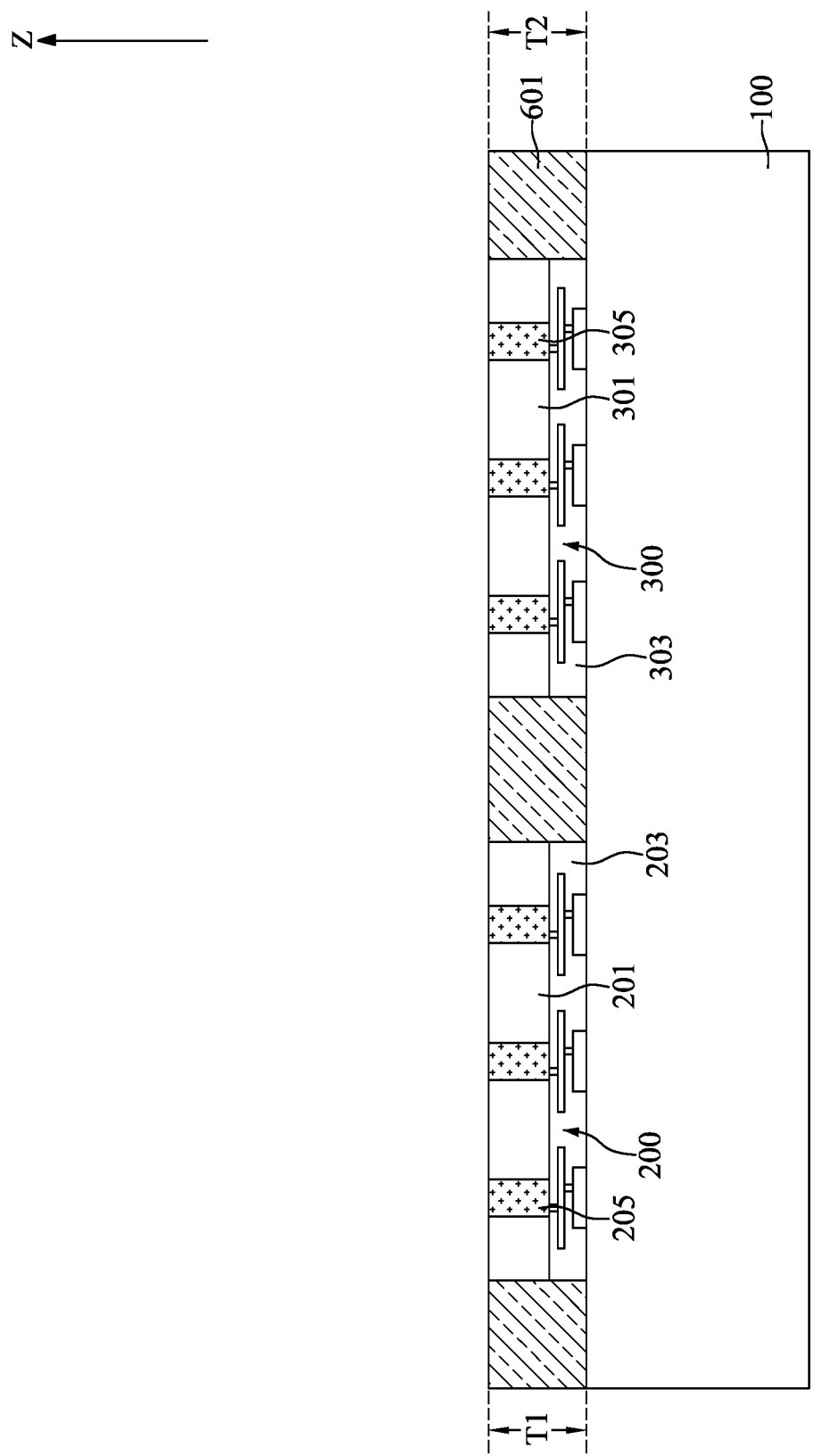

With reference to FIGS. 1, 3, and 4, at step S13, a bottom isolation layer 601 may be formed over the bottom substrate 100 and a planarization process may be performed to expose the plurality of through substrate vias 205, 305 of the first bottom chip 200 and the second bottom chip 300.

With reference to FIG. 3, the bottom isolation layer 601 may be conformally formed over the bottom substrate 100 to cover the first bottom chip 200 and the second bottom chip 300 and at least partially fill the first gap G1 between the first bottom chip 200 and the second bottom chip 300. In some embodiments, the first gap G1 may be completely filled by the bottom isolation layer 601. In some embodiments, the bottom isolation layer 601 may be formed of, for example, a material having etch selectivity to the substrate 201 and the substrate 301. In some embodiments, the bottom isolation layer 601 may be formed of, for example, silicon oxide. In some embodiments, the bottom isolation layer 601 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The bottom isolation layer 601 may be formed by deposition processes such as chemical vapor deposition, plasma-enhanced chemical vapor deposition, or the like.

With reference to FIG. 4, a planarization process, such as chemical mechanical polishing, may be performed until top surfaces of the plurality of through substrate vias 205 and the plurality of through substrate vias 305 are exposed to remove excess material, provide a substantially flat surface for subsequent processing steps. In some embodiments, after the planarization process, the first bottom chip 200 and the second bottom chip 300 may have a same thickness but is not limited thereto. In some embodiments, the thickness T1 of the first bottom chip 200 may be less than or equal to about 10 μm. In some embodiments, the thickness T2 of the second bottom chip 300 may be less than or equal to about 10 μm. In some embodiments, the first bottom chip 200 and the second bottom chip 300 may together configure a bottom tier of stack. The thickness of the bottom tier of stack may be less than or equal to about 10 μm.

Due to the bottom isolation layer 601 completely filled or partially filled the first gap G1, the top surfaces of the plurality of through substrate vias 205 and the top surfaces of the plurality of through substrate vias 305, the top surface of the substrate 201, the top surface of the substrate 301, and the top surface of the bottom isolation layer 601 may be substantially coplanar.

In contrast, if the first gap G1 between the first bottom chip 200 and the second bottom chip 300 were not filled, the thickness uniformity may be worse, and the edge of chips may be rounding. Both phenomena may cause serious adverse impact to the following processes so as to affect the yield and quality of the fabricated semiconductor device.

In addition, the planarization process is performed after the first bottom chip 200 and the second bottom chip 300 bonded onto the bottom substrate 100, a carrier substrate may not be required to provide support during bonding. The lack of a carrier substrate may lower manufacturing costs and increase yield.

Figure 5:
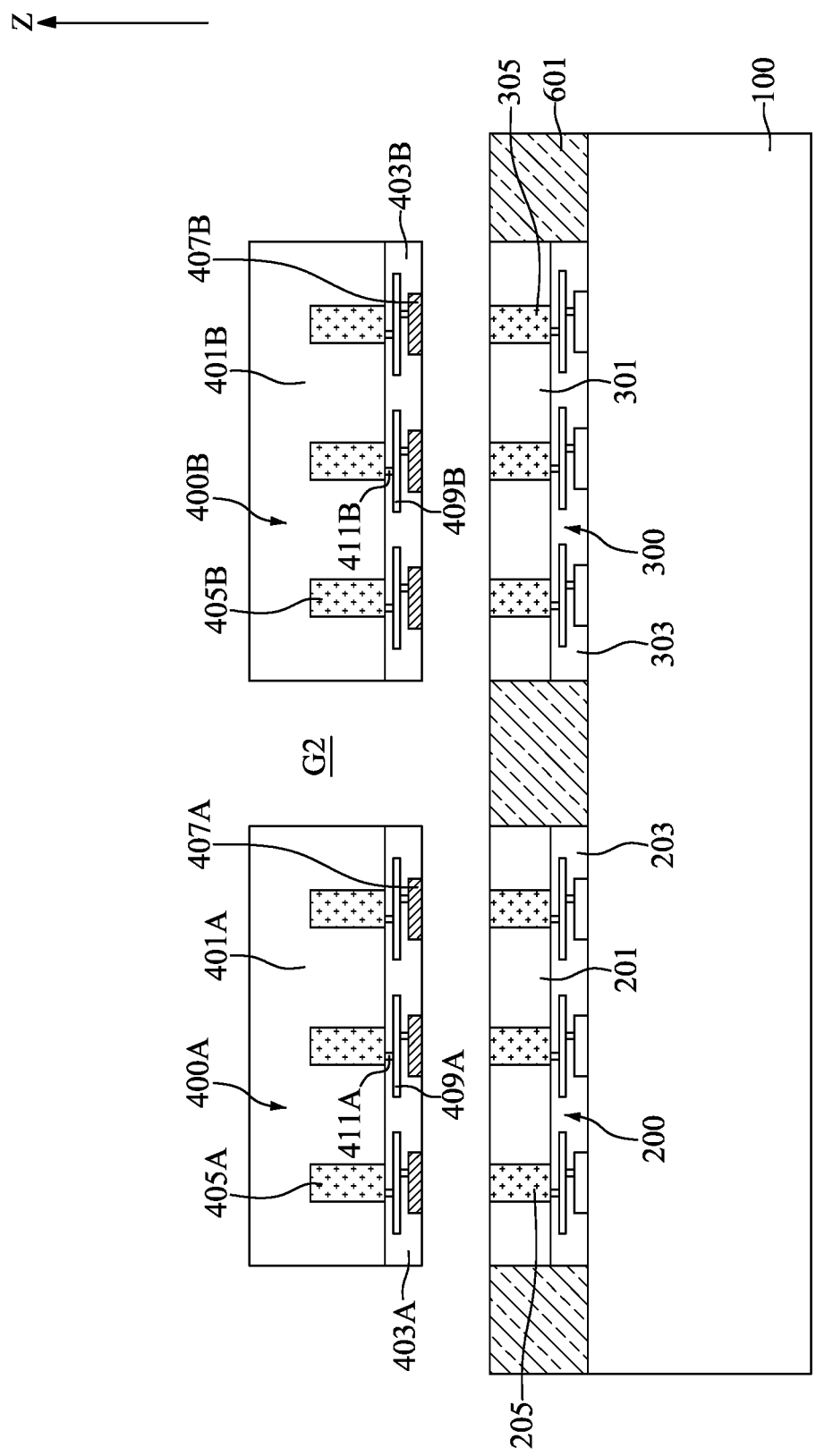
Figure 6:
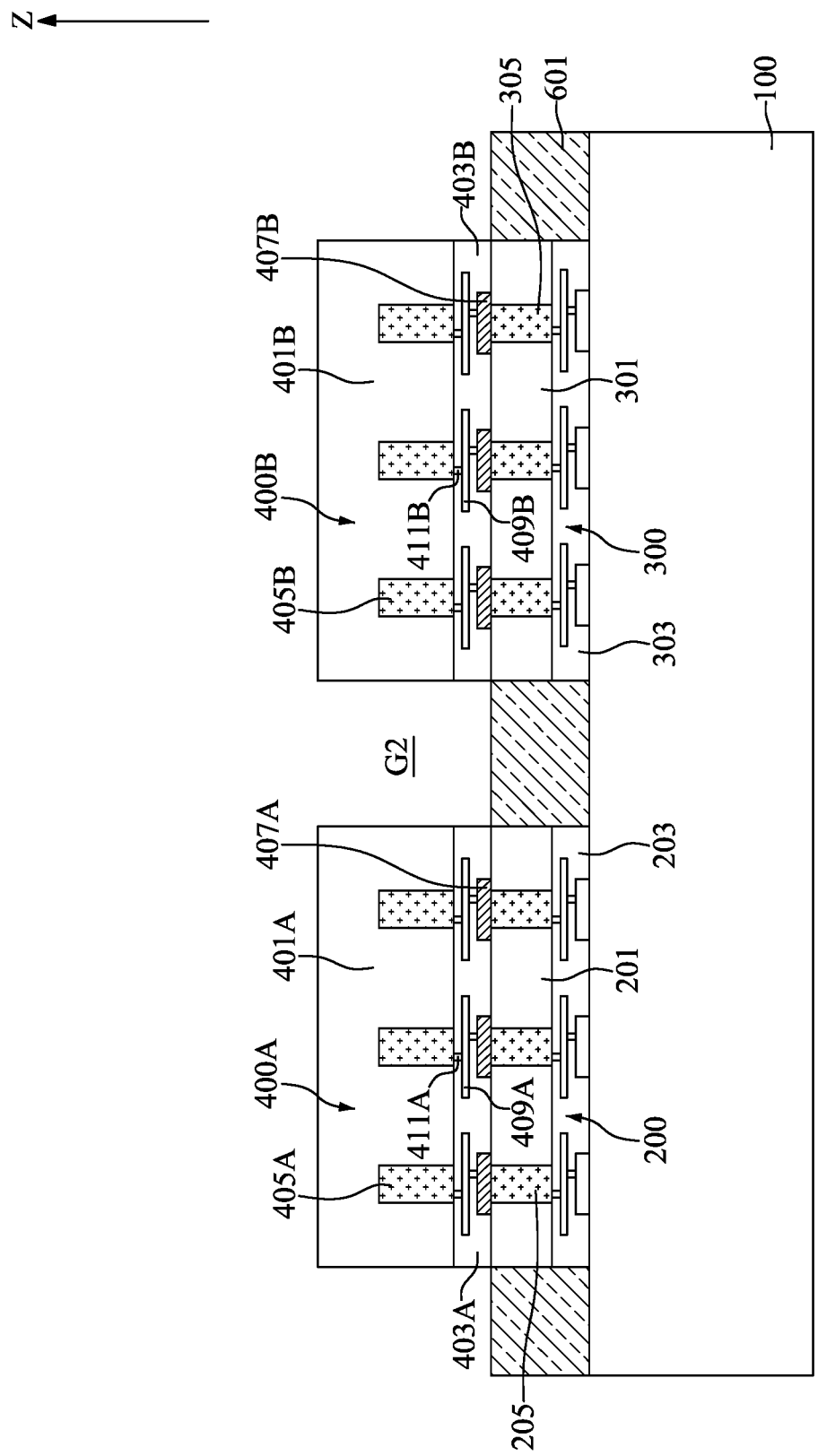

With reference to FIGS. 1, 5 and 6, at step S15, a first stacking chip 400A may be bonded onto the first bottom chip 200 and a second stacking chip 400B may be bonded onto the second bottom chip 300.

With reference to FIG. 5, the first stacking chip 400A may include a substrate 401A, an inter-dielectric layer 403A, a plurality of through substrate vias 405A, a plurality of device elements (not shown for clarity), and a plurality of conductive features (not shown for clarity).

With reference to FIGS. 5 and 6, the inter-dielectric layer 403A may be bonded onto the first bottom chip 200. In some embodiments, the inter-dielectric layer 403A may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of device elements and the plurality of conductive features may be formed in the inter-dielectric layer 403A and electrically coupled to each other.

The device elements of the first stacking chip 400A may be transistors such as complementary metal-oxide-semiconductor transistors, metal-oxide-semiconductor field-effect transistors, fin field-effect-transistors, the like, or a combination thereof. The conductive features of the first stacking chip 400A may include a plurality of conductive pads 407A, a plurality of interconnect layers 409A, and a plurality of conductive vias 411A. The interconnect layers 409A may be separated from each other and may be horizontally disposed in the inter-dielectric layer 203 along the direction Z. In the present embodiment, the bottommost interconnect layers 409A may be designated as the conductive pads 407A. The conductive vias 411A may connect adjacent interconnect layers 409A along the direction Z, adjacent device element and interconnect layer 409A, and adjacent conductive pad 407A and interconnect layer 409A. In some embodiments, the conductive vias 411A may improve heat dissipation in the inter-dielectric layer 403A and may provide structure support in the inter-dielectric layer 403A. The plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

The plurality of device elements, the plurality of conductive features may together configure functional units of the first stacking chip 400A. In some embodiments, the functional units of the first stacking chip 400A may cooperate together and provide a logic functionality. In some embodiments, the functional units of the first stacking chip 400A may cooperate together and provide a memory functionality. In some embodiments, the functional units of the first stacking chip 400A may only include core storage circuit such as I/O and clocking circuit. The functional units of the first stacking chip 400A may not include any control circuit or high-speed circuit. The configuration of aforementioned elements of the first stacking chip 400A may be referred to as the layout of the first stacking chip 400A. In some embodiments, the layout of the first stacking chip 400A and the layout of the first bottom chip 200 are different. For example, the layout of the first stacking chip 400A and the layout of the first bottom chip 200 are symmetrical to each other. For another example, the layout of the first stacking chip 400A may be reflection symmetrical with respect to the layout of the first bottom chip 200. In some embodiments, the layout of the first stacking chip 400A and the layout of the first bottom chip 200 may are the same.

With reference to FIGS. 5 and 6, the substrate 401A may be formed on the inter-dielectric layer 403A. The substrate 401A may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

With reference to FIGS. 5 and 6, the through substrate via 405A may be formed in the substrate 401A. The bottom surfaces of the plurality of through substrate vias 405A may be substantially coplanar with the interface between the substrate 401A and the inter-dielectric layer 403A. The plurality of through substrate vias 405A may be electrically coupled to the plurality of device elements of the first stacking chip 400A through the plurality of conductive features of the first stacking chip 400A. In some embodiments, the configuration of the plurality of through substrate vias 405A may be also referred to as part of the layout of the first stacking chip 400A.

With reference to FIGS. 5 and 6, the second stacking chip 400B may be bonded onto the second bottom chip 300. The second stacking chip 400B may be distant from the first stacking chip 400A with a second gap G2 interposed therebetween.

With reference to FIGS. 5 and 6, the second stacking chip 400B may include a structure similar to the first stacking chip 400A. For example, the second stacking chip 400B may include a substrate 401B, an inter-dielectric layer 403B, a plurality of through substrate vias 405A, a plurality of device elements, and a plurality of conductive features including a plurality of conductive pads 407B, a plurality of interconnect layers 409B, and a plurality of conductive vias 411B. The same or similar name (or notation) of the second stacking chip 400B as the first stacking chip 400A may have same or similar structure and may be formed of same or similar material. Descriptions thereof are not repeated herein.

In some embodiments, the plurality of device elements, the plurality of conductive features may together configure functional units of the second stacking chip 400B. In some embodiments, the functional units of the second stacking chip 400B may cooperate together and provide a logic functionality. In some embodiments, the functional units of the second stacking chip 400B may cooperate together and provide a memory functionality. In some embodiments, the functional units of the second stacking chip 400B may only include core storage circuit such as I/O and clocking circuit. The functional units of the second stacking chip 400B may not include any control circuit or high-speed circuit. The configuration of aforementioned elements of the second stacking chip 400B may be referred to as the layout of the second stacking chip 400B. In some embodiments, the layout of the second stacking chip 400B and the layout of the second bottom chip 300 are the same. In some embodiments, the layout of the second stacking chip 400B and the layout of the second bottom chip 300 are different. For example, the layout of the second stacking chip 400B and the layout of the second bottom chip 300 are symmetrical to each other. For another example, the layout of the second stacking chip 400B may be reflection symmetrical with respect to the layout of the second bottom chip 300.

With reference to FIGS. 5 and 6, in some embodiments, the first stacking chip 400A and the second stacking chip 400B may have a same thickness but is not limited thereto. In some embodiments, the first stacking chip 400A and the second stacking chip 400B may be bonded onto the first bottom chip 200 and the second bottom chip 300, respectively and correspondingly, through a hybrid bonding process such as thermo-compression bonding, passivation-capping-layer assisted bonding, or surface activated bonding. In some embodiments, the first stacking chip 400A may be bonded onto the first bottom chip 200 in a face-to-back configuration but is not limited thereto. In some embodiments, the second stacking chip 400B may be bonded onto the second bottom chip 300 in a face-to-back configuration but is not limited thereto. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to short the time consuming of the hybrid bonding process. In some embodiments, the hybrid bonding process may include dielectric-to-dielectric bonding, metal-to-metal bonding, and metal-to-dielectric bonding. In some embodiments, a thermal annealing process may be performed after the bonding process to enhance dielectric-to-dielectric bonding and to induce thermal expansion of metal-to-metal bonding so as to further improve the bonding quality.

Figure 7:
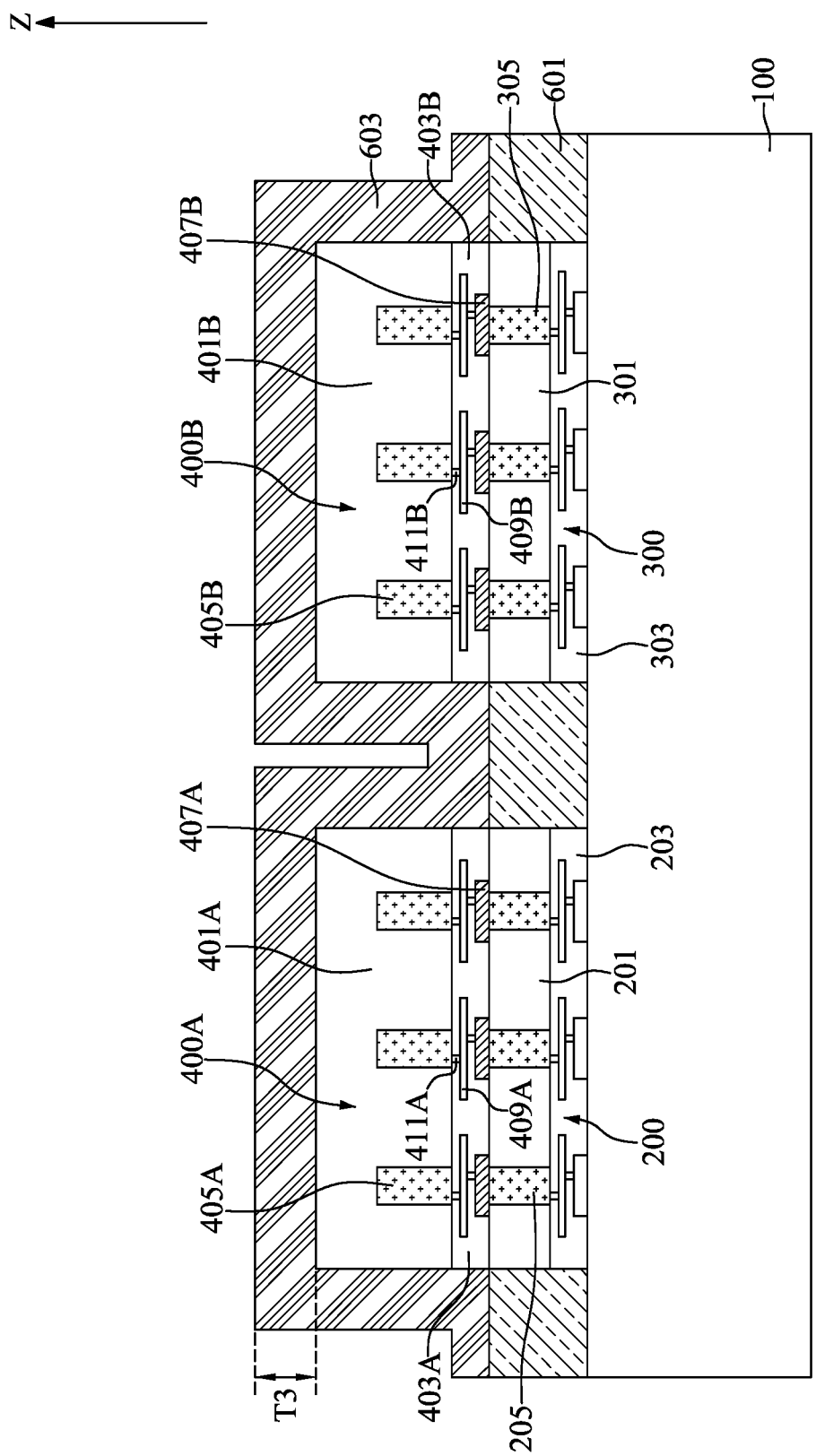

With reference to FIGS. 1 and 7, at step S17, a first isolation layer 603 may be formed over the first stacking chip 400A and the second stacking chip 400B.

With reference to FIG. 7, the first isolation layer 603 may be conformally formed over the bottom isolation layer 601 to cover the first stacking chip 400A and the second stacking chip 400B and at least partially fill the second gap G2 between the first stacking chip 400A and the second stacking chip 400B. That is, the bottom isolation layer 601 may surround the first stacking chip 400A and the second stacking chip 400B. In some embodiments, the thickness T3 of the first isolation layer 603 may be between about 2 μm and about 7 μm, or between about 4 μm and about 5 μm. In some embodiments, the second gap G2 may be completely filled by the first isolation layer 603. In some embodiments, the first isolation layer 603 may be formed of, for example, a material having etch selectivity to the substrate 401A, 401B. In some embodiments, the first isolation layer 603 may be formed of, for example, silicon oxide. In some embodiments, the first isolation layer 603 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The first isolation layer 603 may be formed by deposition processes such as chemical vapor deposition, plasma-enhanced chemical vapor deposition, or the like.

Figure 8:
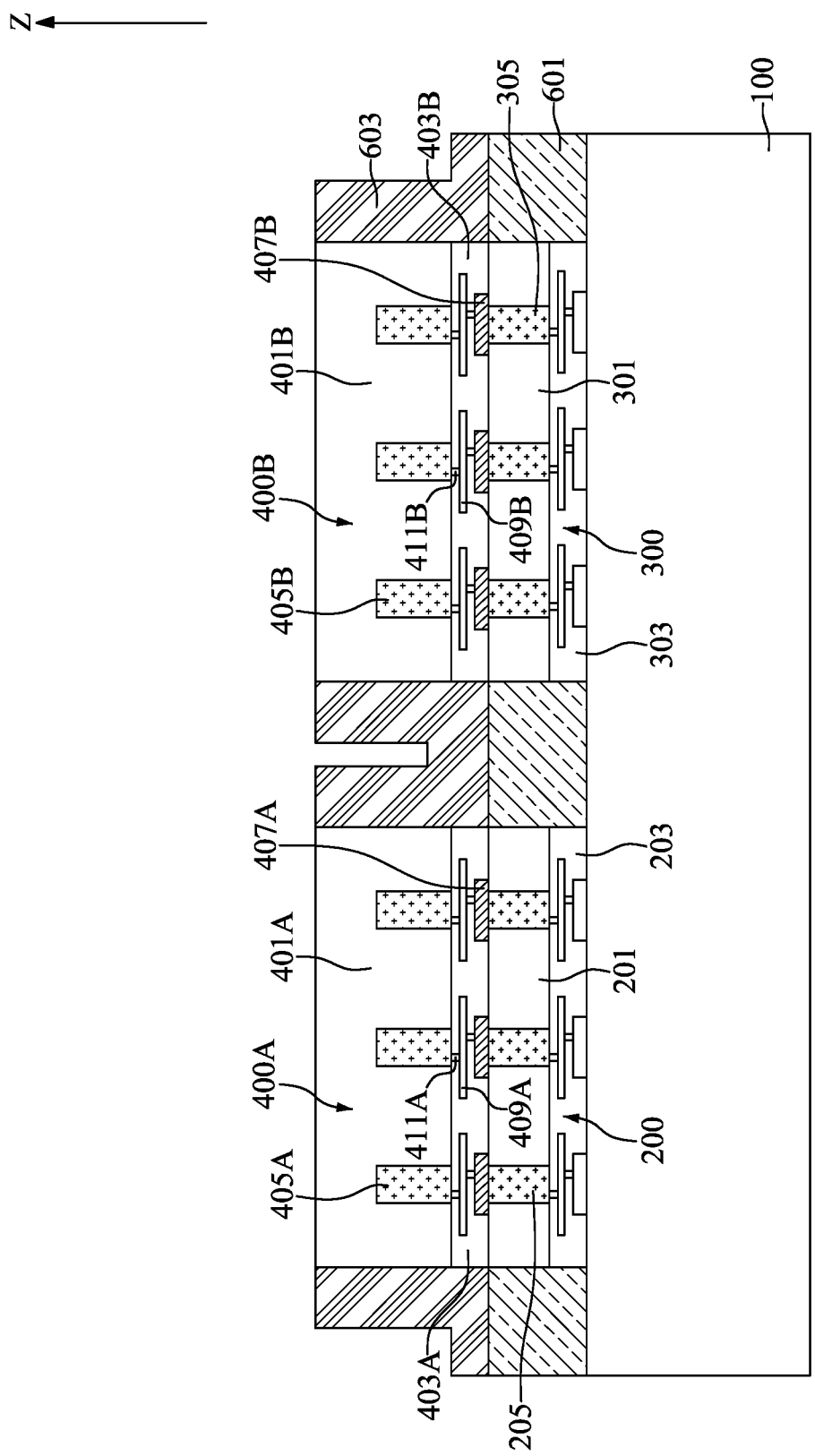

With reference to FIGS. 1 and 8, at step S19, a thinning process may be performed to expose back surfaces of the first stacking chip 400A and the second stacking chip 400B.

With reference to FIG. 8, the thinning process may be accomplished, e.g., using wafer grinding, mechanical abrasion, polishing, or the like, or using chemical removal, such as a wet etch. An advantageous, but not limiting, feature of the illustrated embodiment is that by bonding the first stacking chip 400A and the second stacking chip 400B prior to thinning, a carrier substrate may not be required to provide support during bonding. The lack of a carrier substrate may lower manufacturing costs and increase yield. The thinning process may allow for improved thermal dissipation and provide for a lower device profile. It should be noted that, in the current stage, the top surface of the first isolation layer 603 and the back surfaces of the first stacking chip 400A and the second stacking chip 400B may be substantially coplanar.

Figure 9:
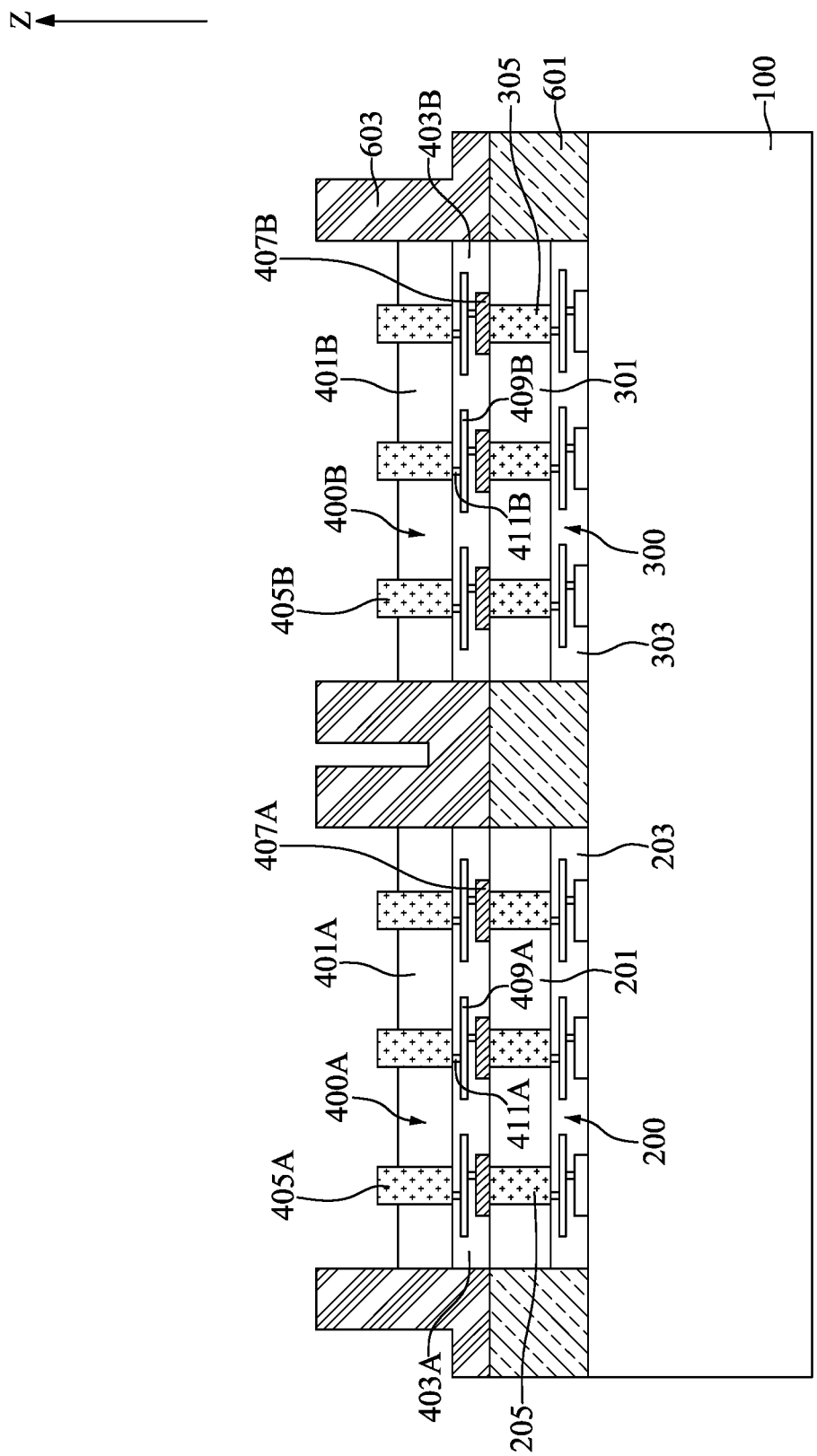

With reference to FIGS. 1 and 9, at step S21, a removal process may be performed to expose the plurality of through substrate vias 405A, 405B of the first stacking chip 400A and the second stacking chip 400B.

With reference to FIG. 9, the removal process may be, for example, an etch process. Specifically, the etch process may be a dry etch process. The etch process may selectively remove the substrate 401A, 401B of the first stacking chip 400A and the second stacking chip 400B. The etch rate ratio of the substrate 401A, 401B to the first isolation layer 603 may be between about 100:1 and about 1.05:1, between about 15:1 and about 2:1, or between about 10:1 and about 2:1 during the etch process. The etch rate ratio of the substrate 401A, 401B to the through substrate vias 405A, 405B may be between about 100:1 and about 1.05:1, between about 15:1 and about 2:1, or between about 10:1 and about 2:1 during the etch process. Employing the etch process instead of chemical mechanical polishing process may provide better thickness uniformity of the substrate 401A, 401B. It should be noted that, in the current stage, the top surface of the first isolation layer 603 may be at a vertical level higher than a vertical level of the top surface of the plurality of through substrate vias 405A, 405B and a vertical level of the back surfaces of the substrate 401A, 401B. The plurality of through substrate vias 405A, 405B may protrude from the top surfaces of the substrate 401A, 401B, respectively and correspondingly.

Figure 10:
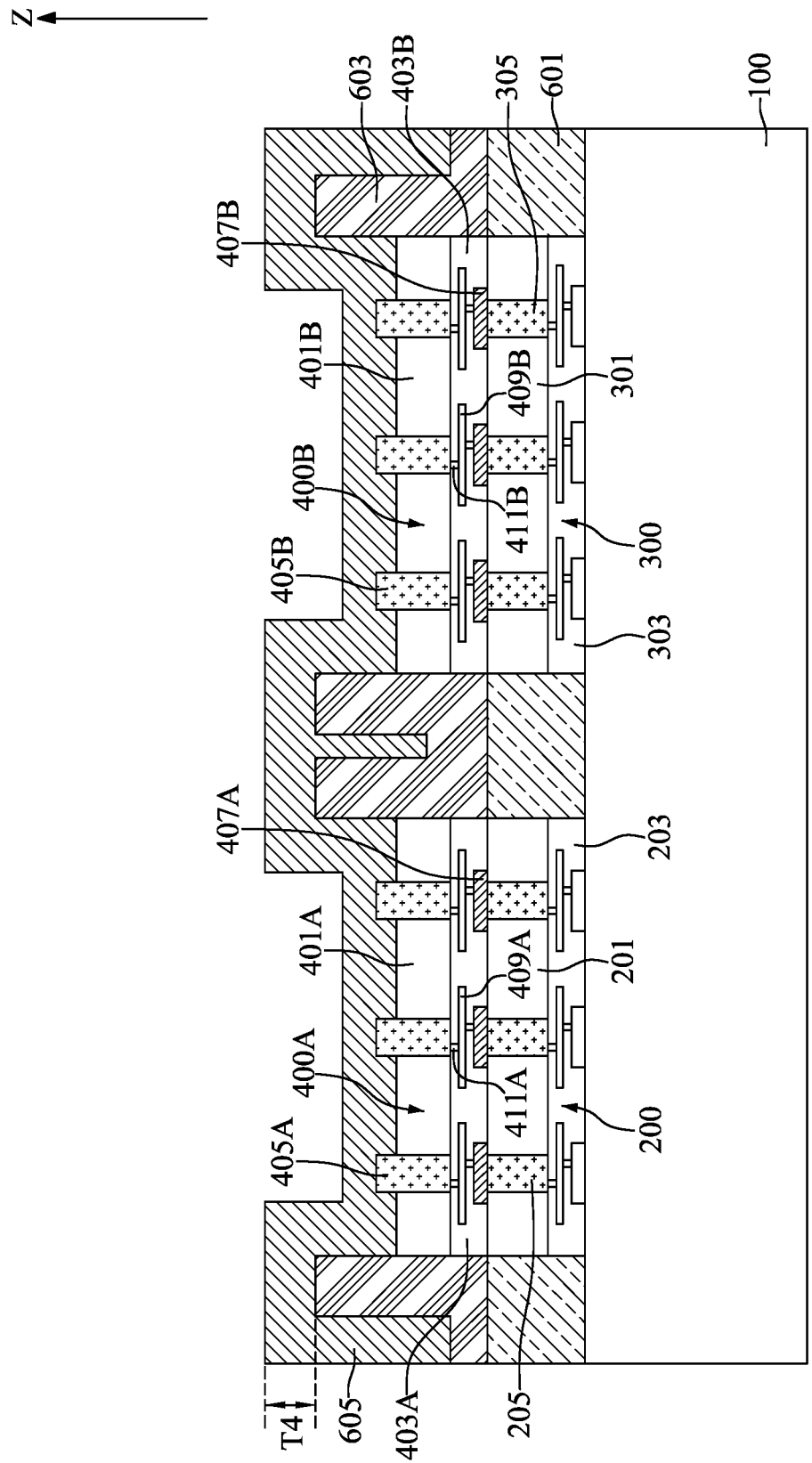

With reference to FIGS. 1 and 10, at step S23, a first capping layer 605 may be formed to cover the plurality of through substrate vias 405A, 405B of the first stacking chip 400A and the second stacking chip 400B.

With reference to FIG. 10, the first capping layer 605 may be conformally formed over the first stacking chip 400A and the second stacking chip 400B to cover the plurality of through substrate vias 405A, 405B, the substrate 401A, 401B, and the first isolation layer 603. In some embodiments, the thickness T4 of the first capping layer 605 may be between about 2 μm and about 8 μm, or about 4 μm and about 5 μm. In some embodiments, the first capping layer 605 may be formed of a same material as the first isolation layer 603. In some embodiments, the first capping layer 605 may be formed of, for example, silicon oxide. In some embodiments, the first capping layer 605 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The first capping layer 605 may be formed by deposition processes such as chemical vapor deposition, plasma-enhanced chemical vapor deposition, or the like.

Figure 11:
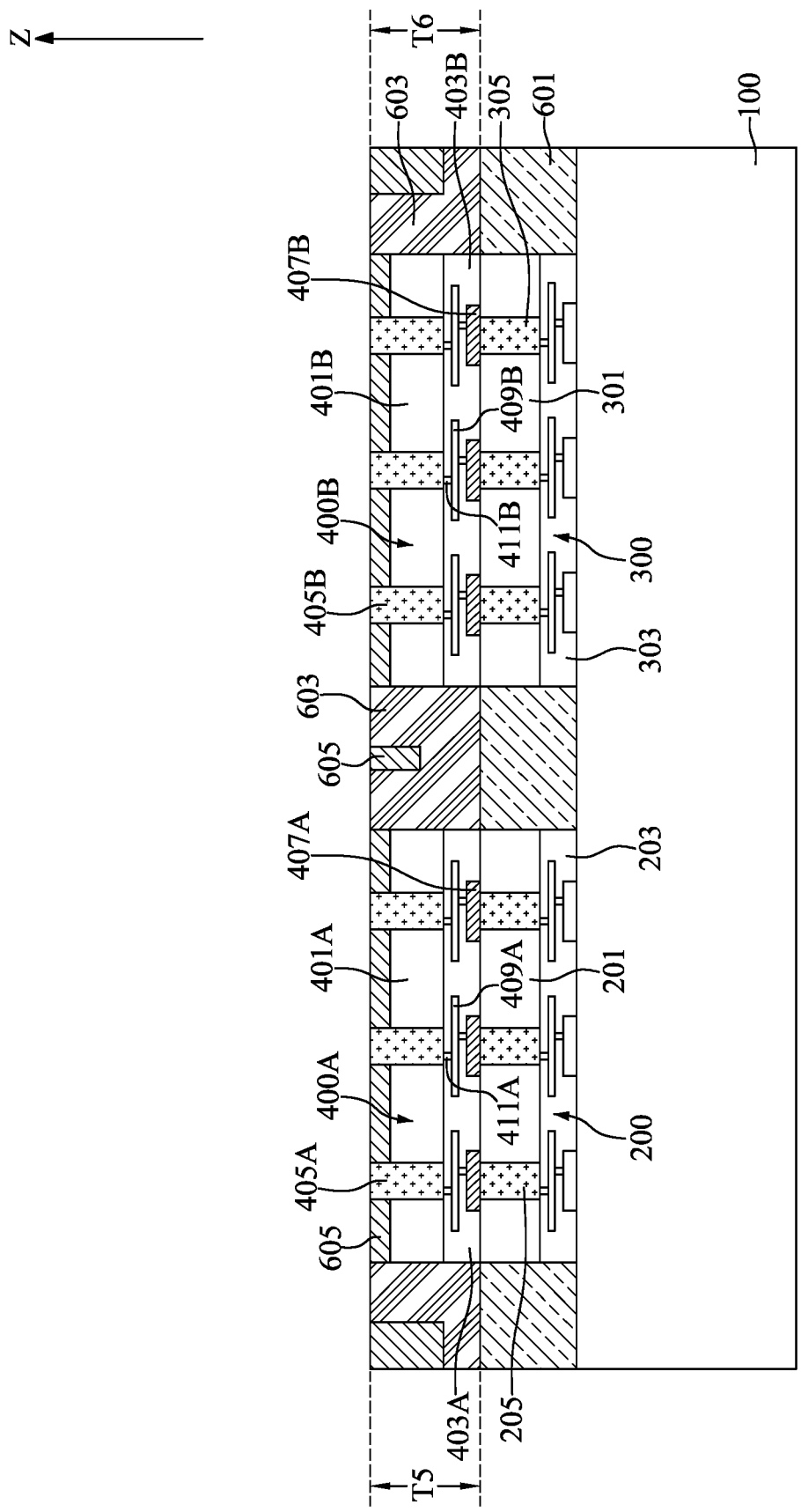

With reference to FIGS. 1 and 11, at step S25, a planarization process may be performed to expose the top surfaces of the plurality of through substrate vias 405A, 405B of the first stacking chip 400A and the second stacking chip 400B.

With reference to FIG. 11, the planarization process, such as chemical mechanical polishing, may be performed until the top surfaces of the plurality of through substrate vias 405A, 405B are exposed to remove excess material, provide a substantially flat surface for subsequent processing steps. After the planarization, the top surfaces of the plurality of through substrate vias 405A, 405B, and the top surface of first capping layer 605 may be substantially coplanar. In some embodiments, the top surface of the first isolation layer 603 may be substantially coplanar with the top surface of the first capping layer 605. In some embodiments, a portion of the first capping layer 605 may surround the plurality of through substrate vias 405A, 405B. In some embodiments, a portion of the first capping layer 605 may be surrounded by the first isolation layer 603. The first stacking chip 400A and the second stacking chip 400B together configure a first tier of stack. In some embodiments, after the planarization process, the thickness T5 of the first stacking chip 400A may be less than or equal to about 10 μm. In some embodiments, after the planarization process, the thickness T6 of the second stacking chip 400B may be less than or equal to about 10 μm. In some embodiments, after the planarization process, the first tier of stack may be less than or equal to about 10 μm.

With reference to FIG. 1 and FIGS. 12 to 14, at step S27, a third stacking chip 500A may be formed on the first stacking chip 400A and a fourth stacking chip 500B may be formed on the second stacking chip 400B.

Figure 12:
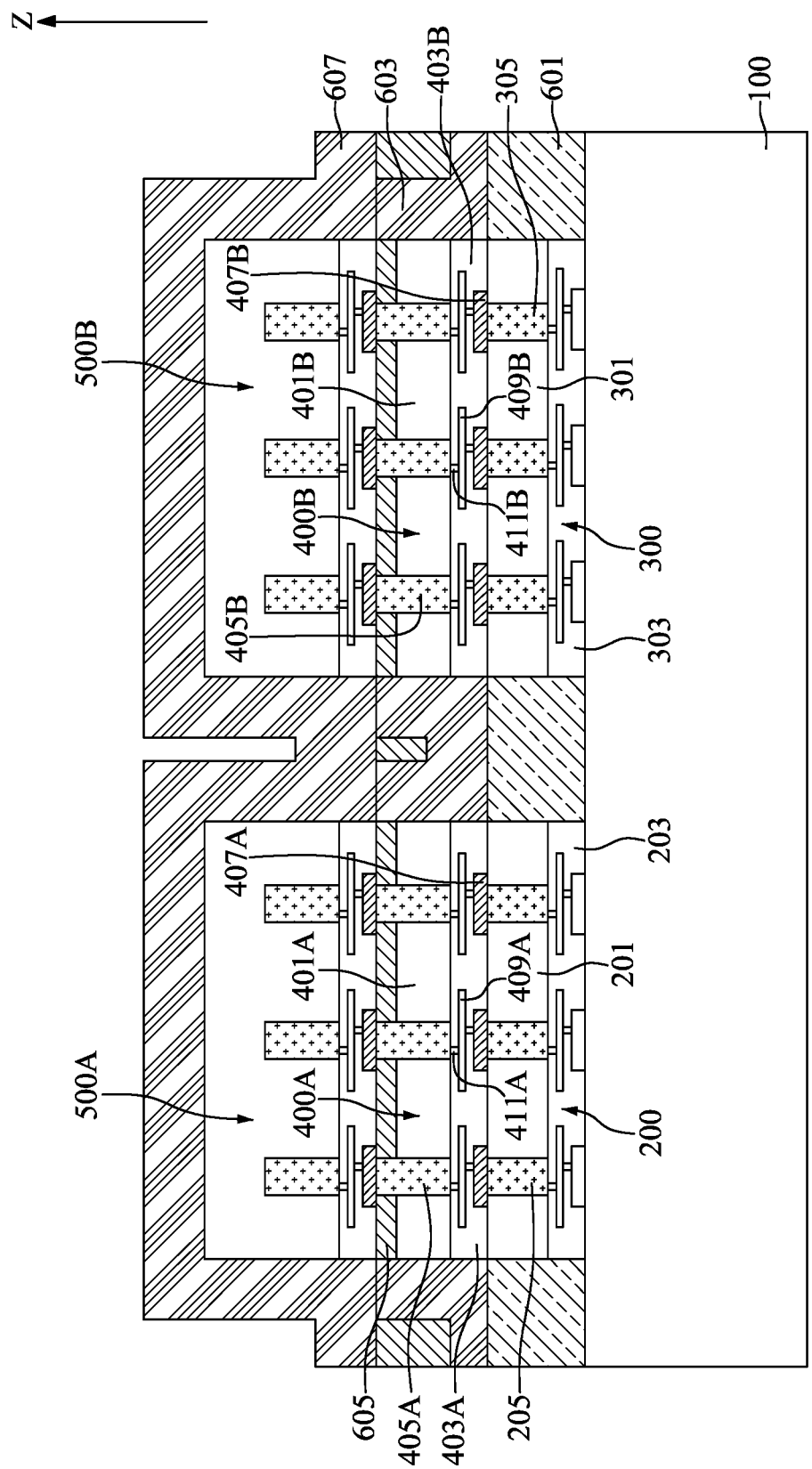

With reference to FIG. 12, the third stacking chip 500A may have a structure similar to the first stacking chip 400A, and descriptions thereof are not repeated herein. The third stacking chip 500A may include memory circuits, logic circuits, or a combination thereof. In some embodiments, the third stacking chip 500A may only include core storage circuit such as I/O and clocking circuit. The third stacking chip 500A may not include any control circuit or high-speed circuit. In some embodiments, the layout of the third stacking chip 500A may be the same as the first stacking chip 400A but is not limited thereto.

With reference to FIG. 12, the fourth stacking chip 500B may have a structure similar to the second stacking chip 400B, and descriptions thereof are not repeated herein. The fourth stacking chip 500B may include memory circuits, logic circuits, or a combination thereof. In some embodiments, the fourth stacking chip 500B may only include core storage circuit such as I/O and clocking circuit. The fourth stacking chip 500B may not include any control circuit or high-speed circuit. In some embodiments, the layout of the fourth stacking chip 500B may be the same as the second stacking chip 400B but is not limited thereto.

With reference to FIG. 12, the third stacking chip 500A and the fourth stacking chip 500B may be bonded onto the first stacking chip 400A and the second stacking chip 400B, respectively and correspondingly, through a hybrid bonding process similar to that illustrated in FIGS. 5 and 6, and descriptions thereof are not repeated herein. A second isolation layer 607 may be formed to cover the third stacking chip 500A and the fourth stacking chip 500B and at least partially fill the gap between the third stacking chip 500A and the fourth stacking chip 500B with a procedure similar to that illustrated in FIG. 7, and descriptions thereof are not repeated herein. In some embodiments, the second isolation layer 607 may have a same material as the first isolation layer 603. In some embodiments, the second isolation layer 607 may be formed of, for example, silicon oxide. In some embodiments, the second isolation layer 607 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0.

Figure 13:
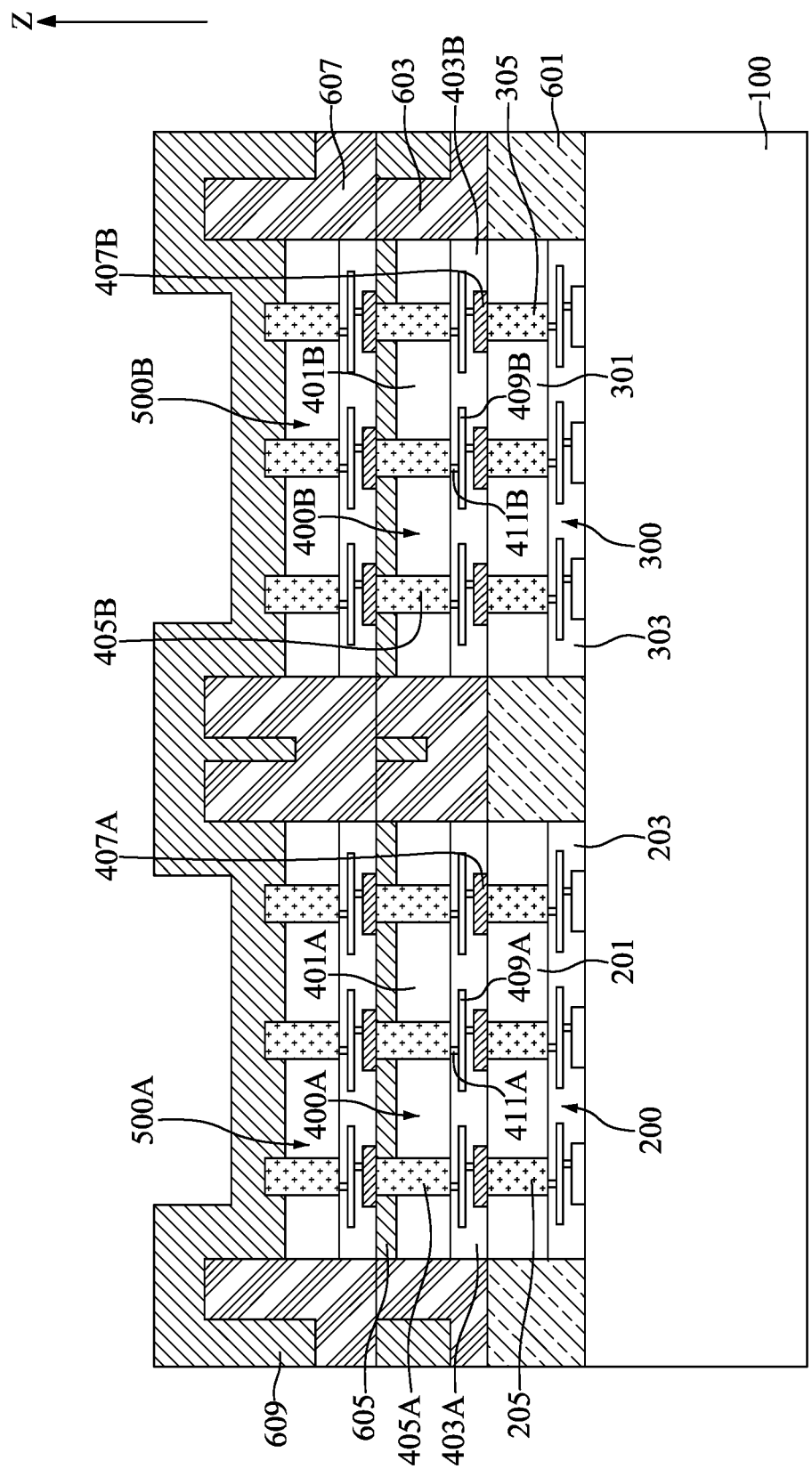

With reference to FIG. 13, a thinning process, a removal process, and a second capping layer 609 may be formed with a procedure similar to that illustrated in FIGS. 8 to 10, and descriptions thereof are not repeated herein. In some embodiments, the second capping layer 609 may be formed of a same material as the first capping layer 605. In some embodiments, the second capping layer 609 may be formed of, for example, silicon oxide. In some embodiments, the second capping layer 609 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0.

Figure 14:
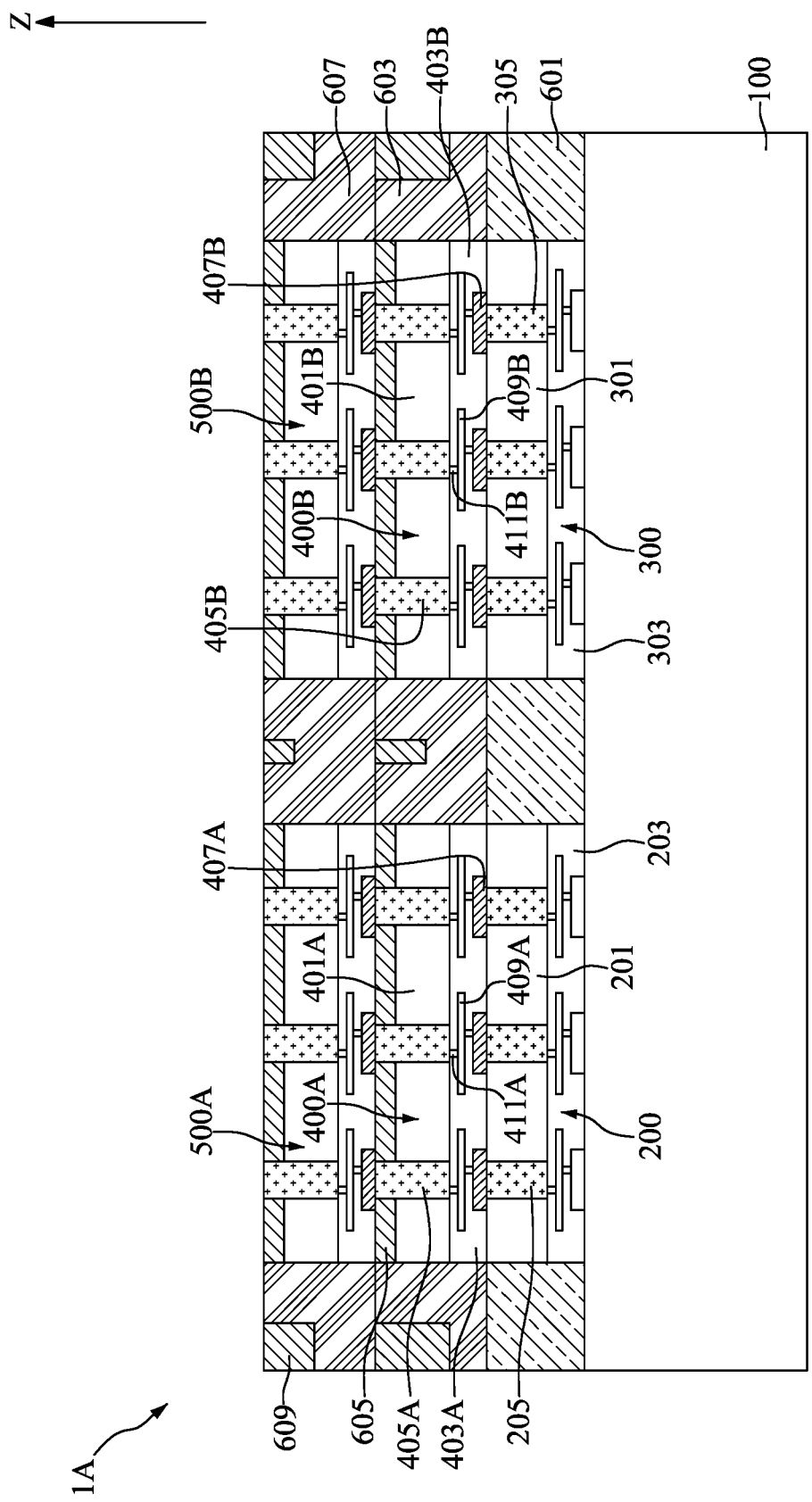
Figure 15:
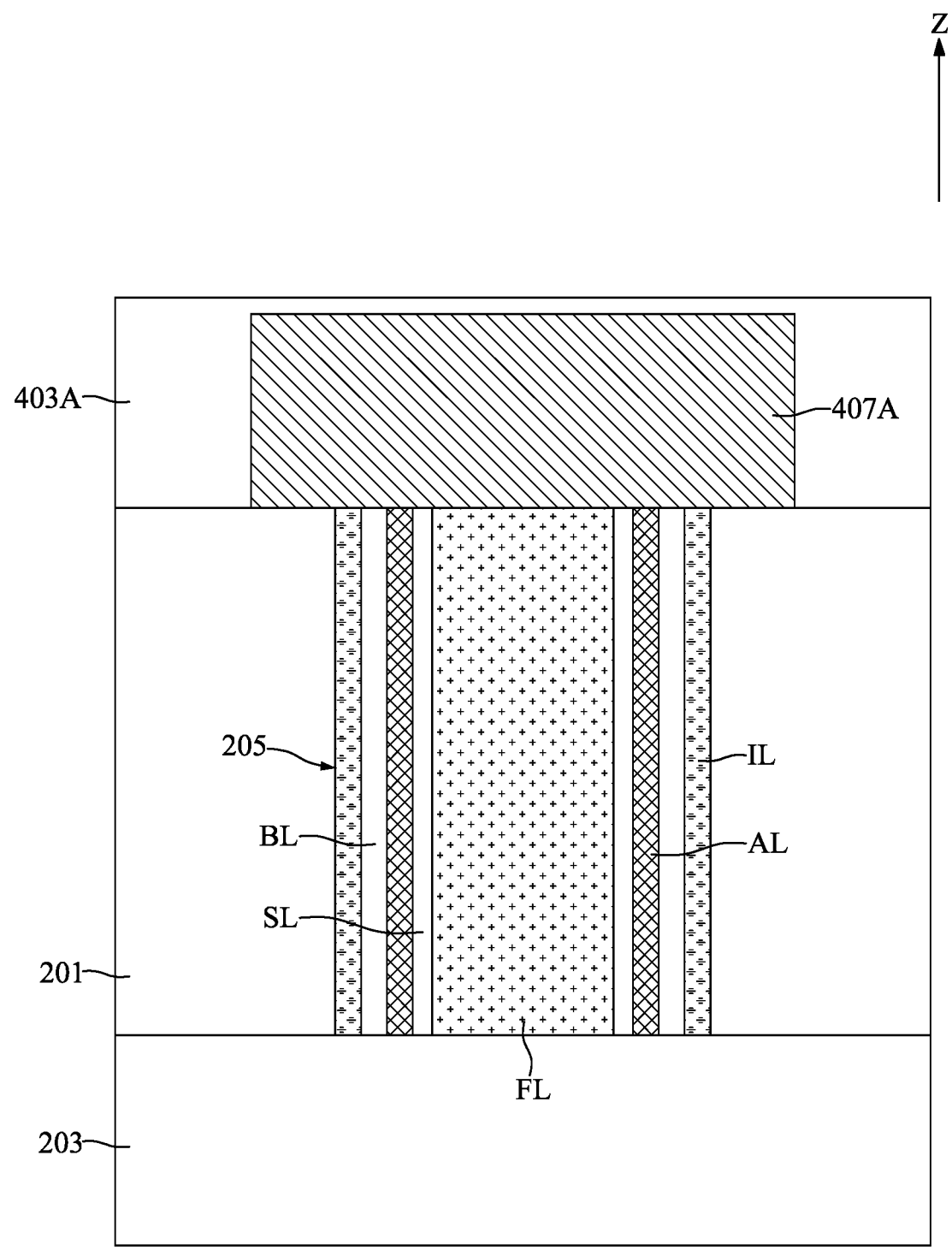
FIG. 15 illustrates, in a schematic close-up cross-sectional view diagram, part of the semiconductor device in accordance with one embodiment of the present disclosure.

With reference to FIG. 14, a planarization process may be performed with a procedure similar to that illustrated in FIG. 11, and descriptions thereof are not repeated herein. The third stacking chip 500A and the fourth stacking chip 500B together configure a second tier of stack. In some embodiments, after the planarization process, the thickness of the third stacking chip 500A may be less than or equal to about 10 µm. In some embodiments, after the planarization process, the thickness of the fourth stacking chip 500B may be less than or equal to about 10 µm. In some embodiments, after the planarization process, the second tier of stack may be less than or equal to about 10 µm.

For brevity, clarity, and convenience of description, only one through substrate via 205 is described.

With reference to FIG. 15, the through substrate via 205 may include a filler layer FL, two seed layers SL, two adhesion layers AL, two barrier layers BL, and two insulation layers IL.

With reference to FIG. 15, the filler layer FL may be disposed along the substrate 201. The filler layer FL may be, for example, copper. The two insulation layers IL may be disposed on the two sides of the filler layer FL. In some embodiments, the two insulation layers IL may be formed of, for example, silicon oxide, silicon nitride, silicon oxynitride, or tetra-ethyl ortho-silicate. The two insulation layers IL may respectively have a thickness between about 50 nm and about 200 nm. Alternatively, in some embodiments, the two insulation layers IL may be formed of, for example, parylene, epoxy, or poly(p-xylene). The two insulation layers IL may respectively have a thickness between about 1 µm and about 5 µm. The two insulation layers IL may ensure the filler layer FL is electrically isolated in the substrate 201.

With reference to FIG. 15, the two barrier layers BL may be disposed between the filler layer FL and the two insulation layers IL. The two barrier layers BL may be formed of, for example, tantalum, tantalum nitride, titanium, titanium nitride, rhenium, nickel boride, or tantalum nitride/tantalum bilayer. The two barrier layers BL may inhibit diffusion of the conductive materials of the filler layer FL into the two insulation layers IL and the substrate 201. The two barrier layers BL may be formed by a deposition process such as physical vapor deposition, atomic layer deposition, chemical vapor deposition, or sputtering.

With reference to FIG. 15, the two adhesion layers AL may be disposed between the filler layer FL and the two barrier layers BL. The two adhesion layers AL may be formed of, for example, titanium, tantalum, titanium tungsten, or manganese nitride. The two adhesion layers AL may improve an adhesion between the two seed layers SL and the two barrier layers BL. The two adhesion layers AL may respectively have a thickness between about 5 nm and about 50 nm. The two adhesion layers AL may be formed by a deposition process such as physical vapor deposition, atomic layer deposition, chemical vapor deposition, or sputtering.

With reference to FIG. 15, the two seed layers SL may be disposed between the filler layer FL and the two adhesion layers AL. The two seed layers SL may respectively have a thickness between about 10 nm and about 40 nm. The two seed layers SL may be formed of, for example, copper or ruthenium. The two seed layers SL may be formed by a deposition process such as physical vapor deposition, atomic layer deposition, chemical vapor deposition, or sputtering. The two seed layers SL may reduce resistivity during the formation of the filler layer FL by an electroplating process.

In some embodiments, the through substrate vias 305, 405A, 405B, and the through substrate vias of the third stacking chip 500A and the fourth stacking chip 500B may have the same structure as the through substrate via 205 illustrated in FIG. 15.

FIGS. 16 to 22 illustrate, in schematic cross-sectional view diagrams, semiconductor devices 1B, 1C, 1D, 1E, 1F, 1G, and 1H in accordance with some embodiments of the present disclosure.

Figure 16:
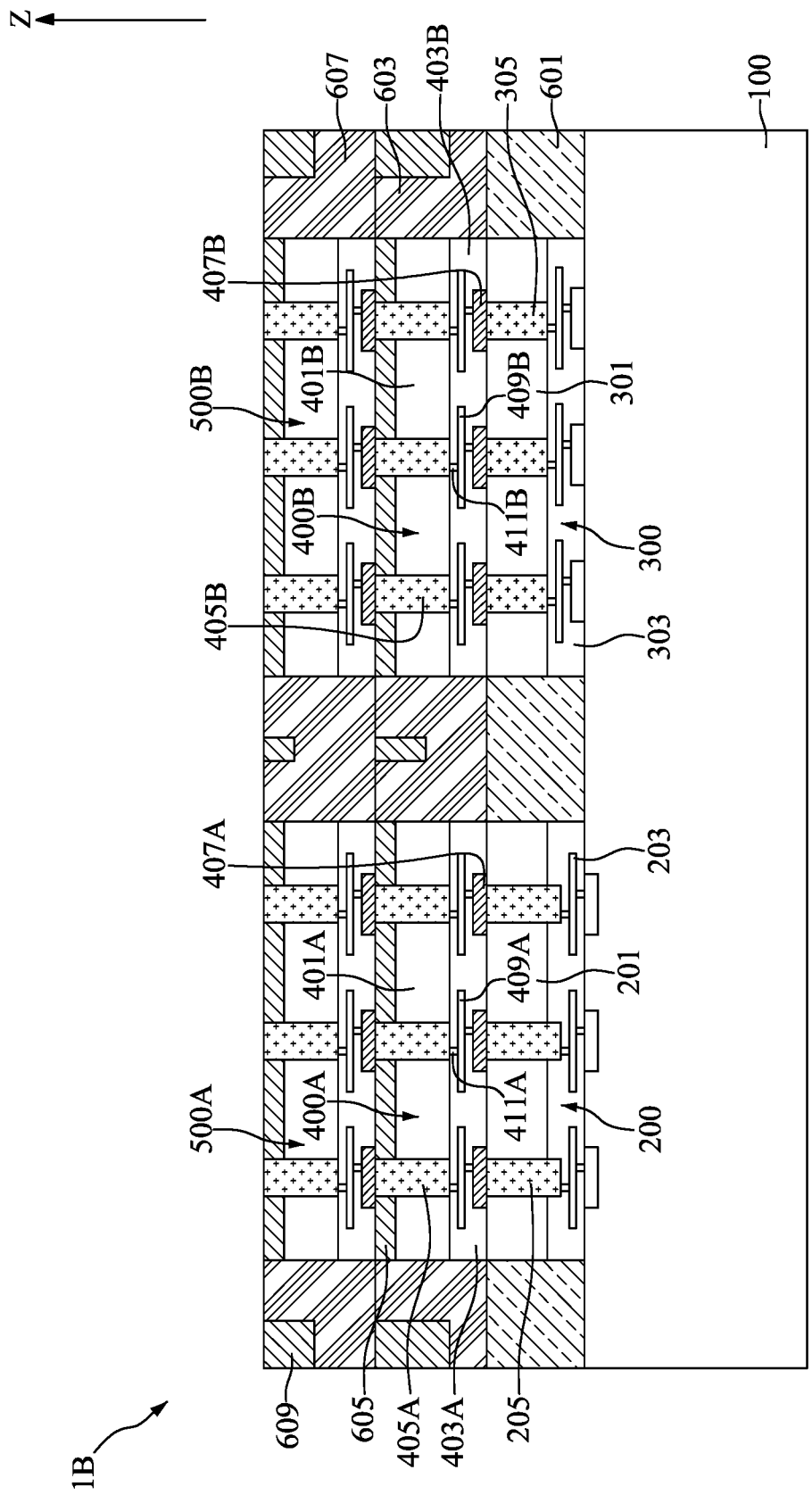
FIGS. 16 to 22 illustrate, in schematic cross-sectional view diagrams, semiconductor devices in accordance with some embodiments of the present disclosure.

With reference to FIG. 16, the semiconductor device 1B may have a structure similar to that illustrated in FIG. 14. The same or similar elements in FIG. 16 as in FIG. 14 have been marked with similar reference numbers and duplicative descriptions have been omitted. For brevity, clarity, and convenience of description, only one through substrate via 205 is described. The through substrate via 205 may be disposed along the substrate 201 and extended to the inter-dielectric layer 203. In some embodiments, the through substrate via 205 may be disposed along the substrate 201 and the inter-dielectric layer 203. The through substrate via 205 may directly contact the front surface of the bottom substrate 100. In some embodiments, the through substrate vias 305, 405A, 405B, and the through substrate vias of the third stacking chip 500A and the fourth stacking chip 500B may have structure similar to the through substrate via 205 illustrated in FIG. 15.

Figure 17:
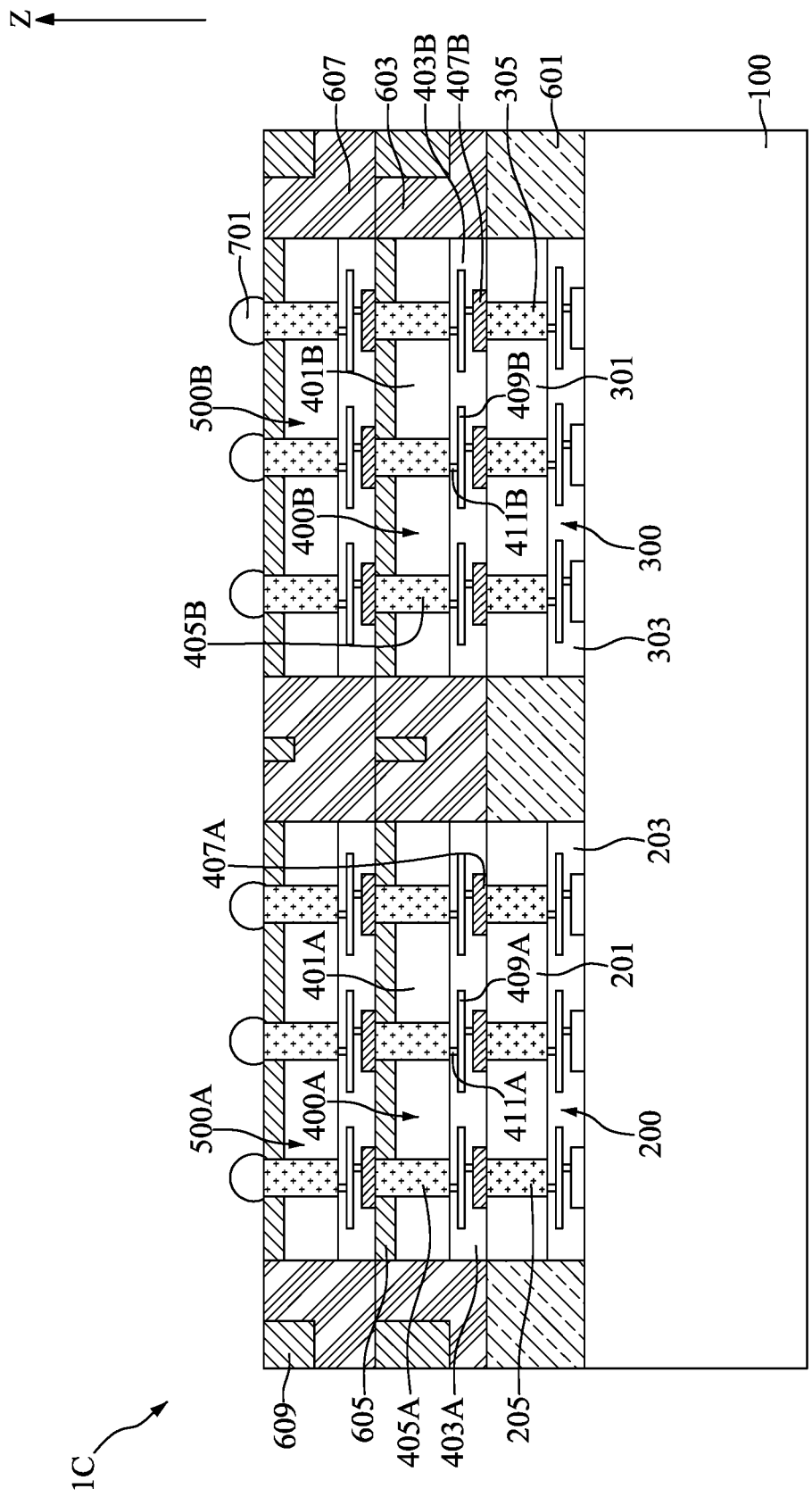

With reference to FIG. 17, the semiconductor device 1C may have a structure similar to that illustrated in FIG. 14. The same or similar elements in FIG. 17 as in FIG. 14 have been marked with similar reference numbers and duplicative descriptions have been omitted. The semiconductor device 1 may include a plurality of connectors 701. The plurality of connectors 701 may be respectively correspondingly disposed on the plurality of through substrate vias of the third stacking chip 500A and the fourth stacking chip 500B. In some embodiments, the plurality of connectors 701 may include a conductive material with low resistivity, such as tin, lead, silver, copper, nickel, bismuth or an alloy thereof, and may be formed by a suitable process such as evaporation, plating, ball drop, or screen printing. In some embodiments, the plurality of connectors 701 may be controlled collapse chip connection (i.e., C4) bumps formed by a C4 process.

In some embodiments, the plurality of connectors 701 may be solder joints. The solder joints may comprise a material such as tin, or other suitable materials, such as silver or copper. In an embodiment in which the solder joints are tin solder joints, the solder joints may be formed by initially forming a layer of tin through evaporation, electroplating, printing, solder transfer, or ball placement to a thickness of about 10 µm to about 100 µm. Once the layer of tin has been formed on the third stacking chip 500A and the fourth stacking chip 500B, a reflow process may be performed to shape the solder joints into the desired shape.

In some embodiments, the plurality of connectors 701 may be pillar bumps formed of, for example, copper. The pillar bumps may be formed directly on the third stacking chip 500A and the fourth stacking chip 500B, without requiring contact pads, under bump metallization, or the like, thus further reducing cost and process complexity of the semiconductor device 1C, which may allow for increased density of pillar bumps. For example, in some embodiments, a critical dimension of a pillar bump (e.g., pitch) may be less than about 5 µm, and the pillar bump may have a height less than about 10 µm. The pillar bumps may be formed using any suitable method, such as, depositing a seed layer, optionally forming an under bump metallurgy, using a mask to define a shape of the pillar bumps, electrochemically plating the pillar bumps in the mask, and subsequently removing the mask and any undesired portions of the seed layer. The pillar bumps may be used to electrically connect the semiconductor device 1C to other package components such as, a fan-out redistribution layer, package substrates, interposers, printed circuit boards, and the like.

Figure 18:
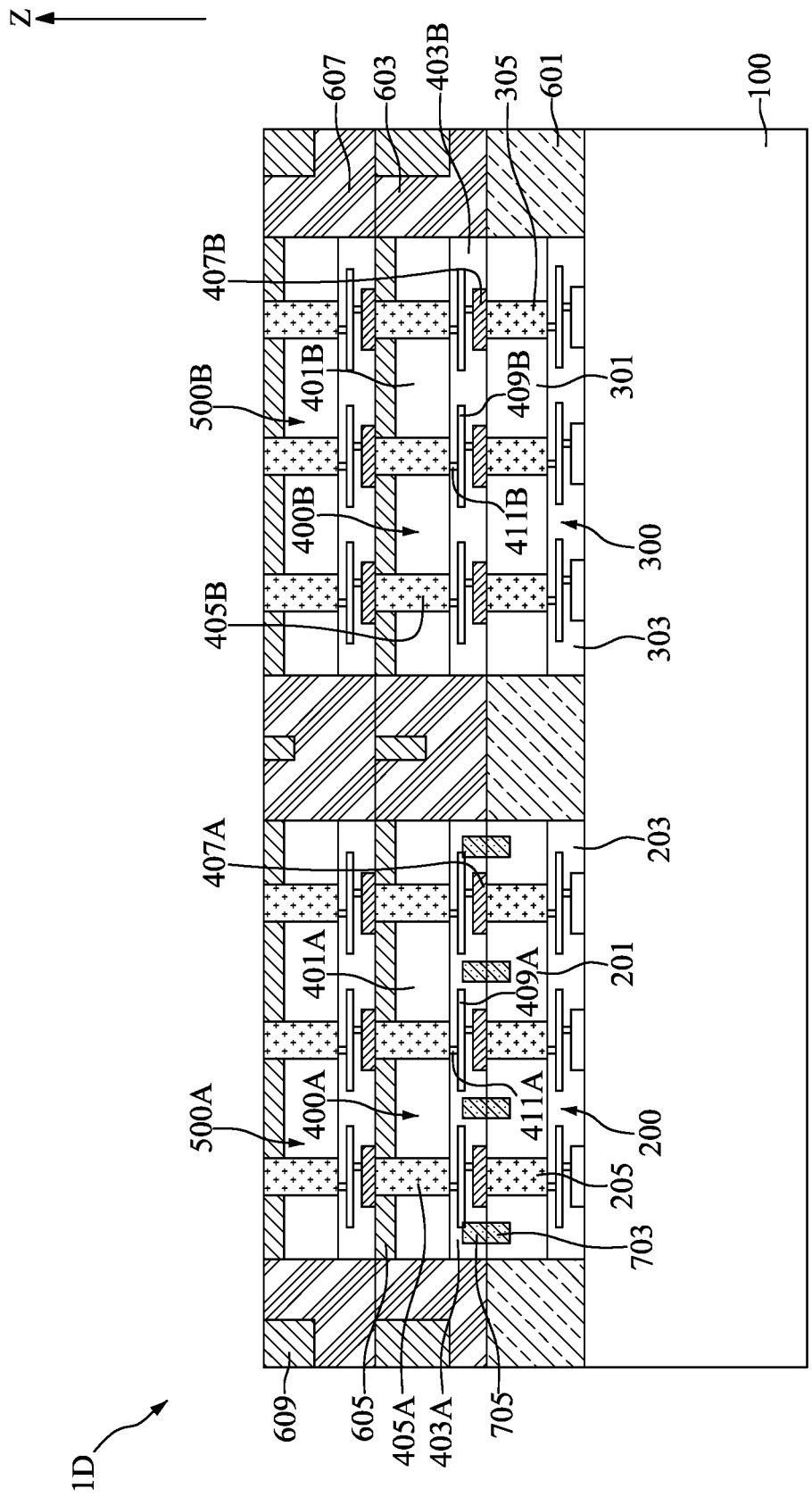

With reference to FIG. 18, the semiconductor device 1D may have a structure similar to that illustrated in FIG. 14. The same or similar elements in FIG. 18 as in FIG. 14 have been marked with similar reference numbers and duplicative descriptions have been omitted.

With reference to FIG. 18, a plurality of first dummy conductive pads 703 may be disposed in the substrate 201 and may be substantially coplanar with the back surface of the first bottom chip 200. A plurality of second dummy conductive pads 705 may be disposed in the inter-dielectric layer 403A, may be substantially coplanar with the back surface of the first bottom chip 200, and directly contacting the plurality of first dummy conductive pads 703. The plurality of first dummy conductive pads 703 and the plurality of second dummy conductive pads 705 may be formed of, for example, a conductive material such as copper, aluminum, or alloy thereof. The plurality of first dummy conductive pads 703 and the plurality of second dummy conductive pads 705 may provide additional metal-to-metal bonding to improve the bonding quality between the first bottom chip 200 and the first stacking chip 400A.

It should be noted that referring to an element as a "dummy" element means that no exterior voltage or current is applied to the element when the semiconductor device is in operation.

Figure 19:
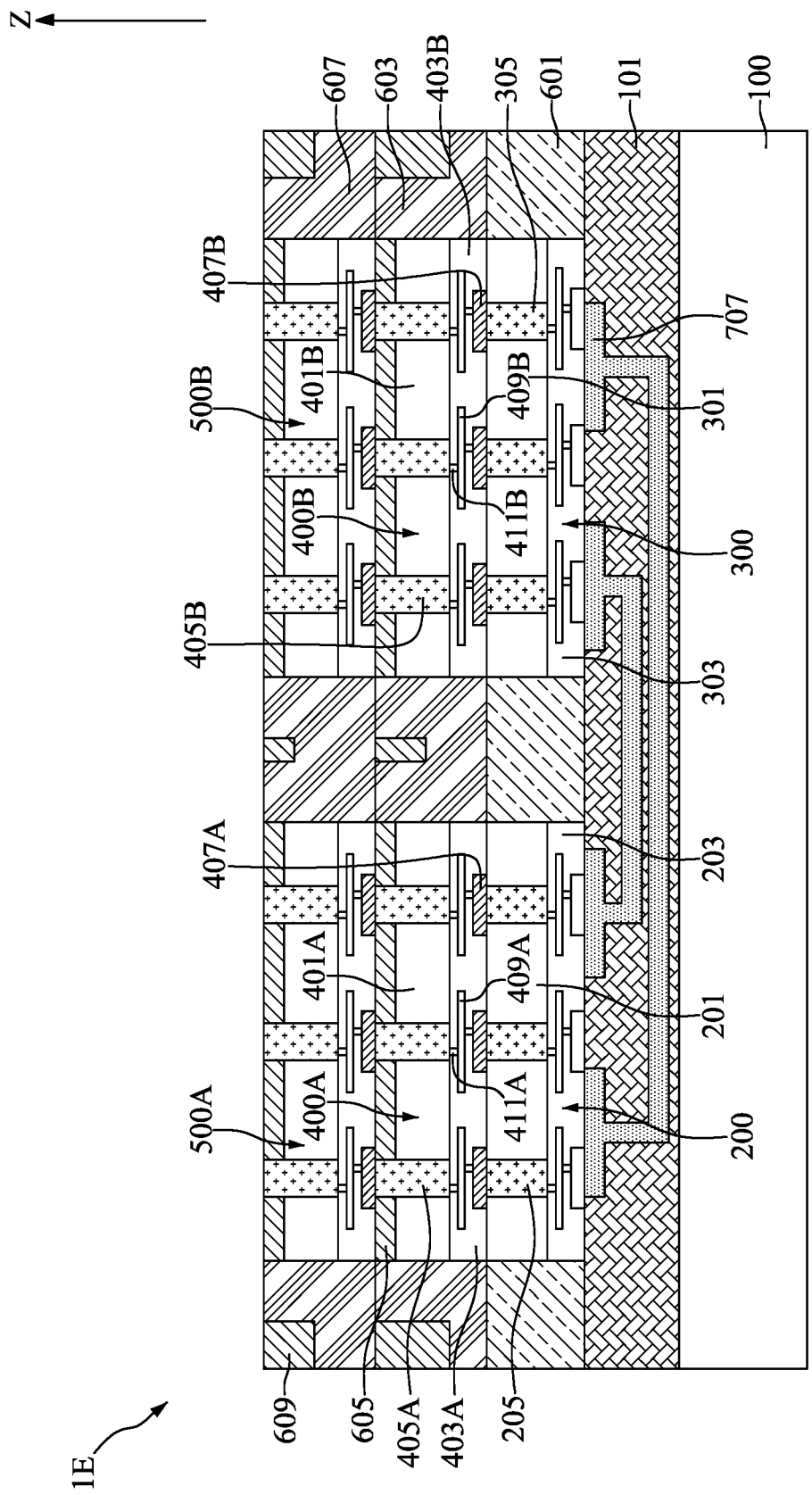

With reference to FIG. 19, the semiconductor device 1E may have a structure similar to that illustrated in FIG. 14. The same or similar elements in FIG. 19 as in FIG. 14 have been marked with similar reference numbers and duplicative descriptions have been omitted.

With reference to FIG. 19, a passivation layer 101 disposed between the bottom substrate 100 and the bottom tier of stack. In some embodiments, the passivation layer 101 may be formed of a polymeric material such as polybenzoxazole, polyimide, benzocyclobutene, ajinomoto buildup film, solder resist film, or the like. The polymeric material (e.g., polyimide) may have a number of attractive characteristics such as the ability to fill openings of high aspect ratio, a relatively low dielectric constant (about 3.2), a simple depositing process, the reduction of sharp features or steps in the underlying layer, and high temperature tolerance after curing.

In some other embodiments, the passivation layer 101 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, the like, or a combination thereof. In some embodiments, the passivation layer 101 may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

With reference to FIG. 19, a plurality of redistribution layers 707 may be disposed in the passivation layer 101 and respectively correspondingly electrically coupled to the device elements of the first bottom chip 200 and the second bottom chip 300.

Generally, the formation of plurality of redistribution layers 707 may include forming one or more dielectric layers using any suitable method (e.g., a spin-on coating technique, sputtering, and the like) and forming conductive features in the dielectric layers. The formation of the conductive features may include patterning the dielectric layers (e.g., using photolithography and/or etching processes) and forming conductive features in the patterned dielectric layers (e.g., by depositing a seed layer, using a mask layer to define the shape of the conductive features, and using an electroless/electrochemical plating process).

The plurality of redistribution layers 707 may be formed of, for example, tungsten, cobalt, zirconium, tantalum, titanium, aluminum, ruthenium, copper, metal carbides, metal nitrides, transition metal aluminides, or a combination thereof.

Figure 20:
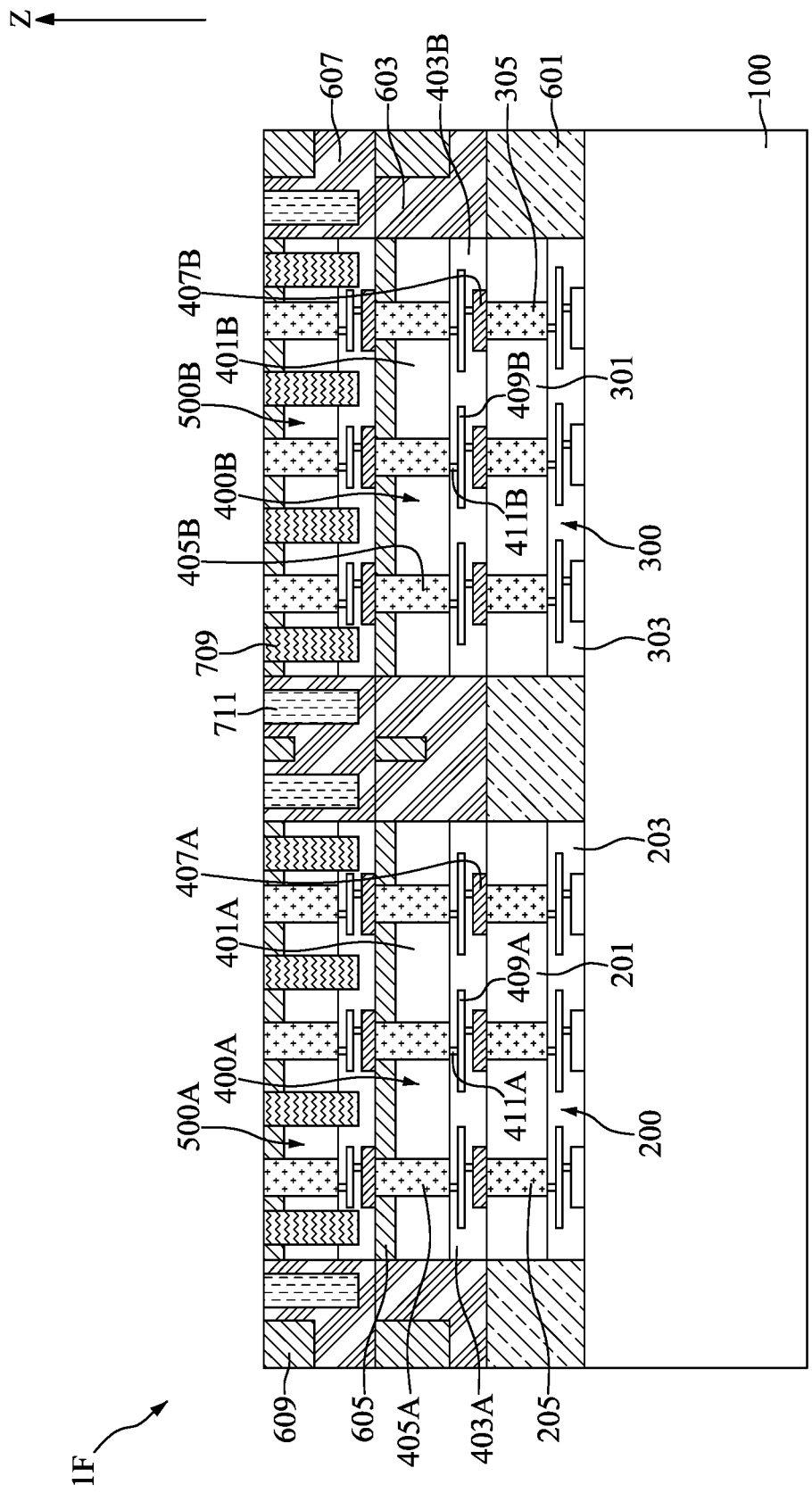

With reference to FIG. 20, the semiconductor device 1F may have a structure similar to that illustrated in FIG. 14. The same or similar elements in FIG. 20 as in FIG. 14 have been marked with similar reference numbers and duplicative descriptions have been omitted.

With reference to FIG. 20, a plurality of first dummy through semiconductor vias 709 may be disposed in the third stacking chip 500A and the fourth stacking chip 500B. The top surfaces of the plurality of first dummy through semiconductor vias 709 may be substantially coplanar with the back surfaces of the third stacking chip 500A and the fourth stacking chip 500B. A plurality of second dummy through semiconductor vias 711 may be disposed in the second isolation layer 607. The top surfaces of the plurality of second dummy through semiconductor vias 711 may be substantially coplanar with the back surfaces of the back surfaces of the third stacking chip 500A and the fourth stacking chip 500B. The plurality of first dummy through semiconductor vias 709 and the plurality of second dummy through semiconductor vias 711 may be formed of structures similar to the through substrate via 205 illustrated in FIG. 15, and descriptions thereof are not repeated herein. The plurality of first dummy through semiconductor vias 709 and the plurality of second dummy through semiconductor vias 711 are not electrically connected to any other conductive features of the semiconductor device 1F. The plurality of first dummy through semiconductor vias 709 and the plurality of second dummy through semiconductor vias 711 may improve the heat dissipation capability of the semiconductor device 1F.

Figure 21:
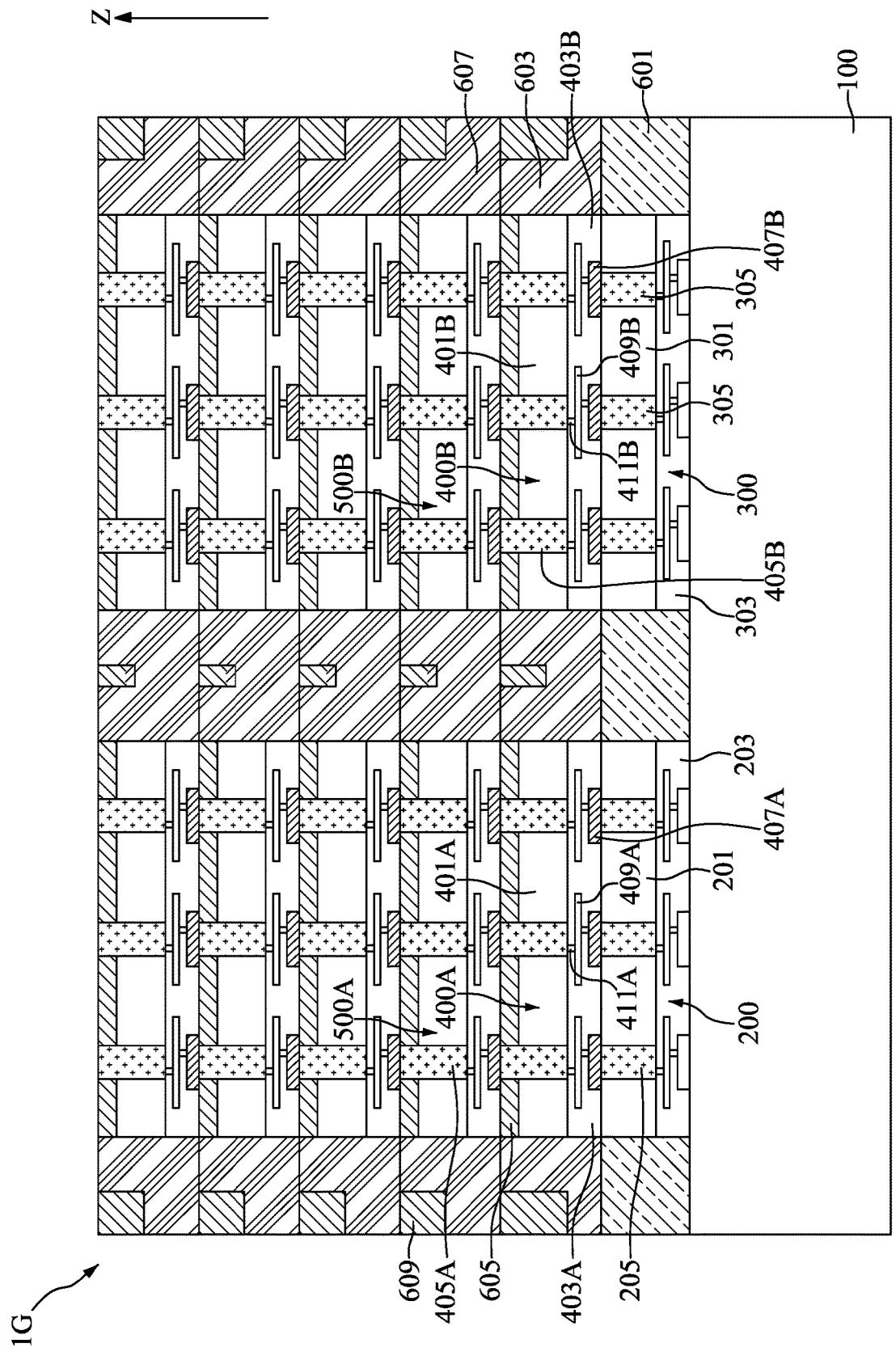

With reference to FIG. 21, the semiconductor device 1G may have a structure similar to that illustrated in FIG. 14. The same or similar elements in FIG. 21 as in FIG. 14 have been marked with similar reference numbers and duplicative descriptions have been omitted. In the semiconductor device 1G, more tier of stack may be sequentially formed on the second tier of stack with a procedure similar to the first tier and second tier of stack.

Figure 22:
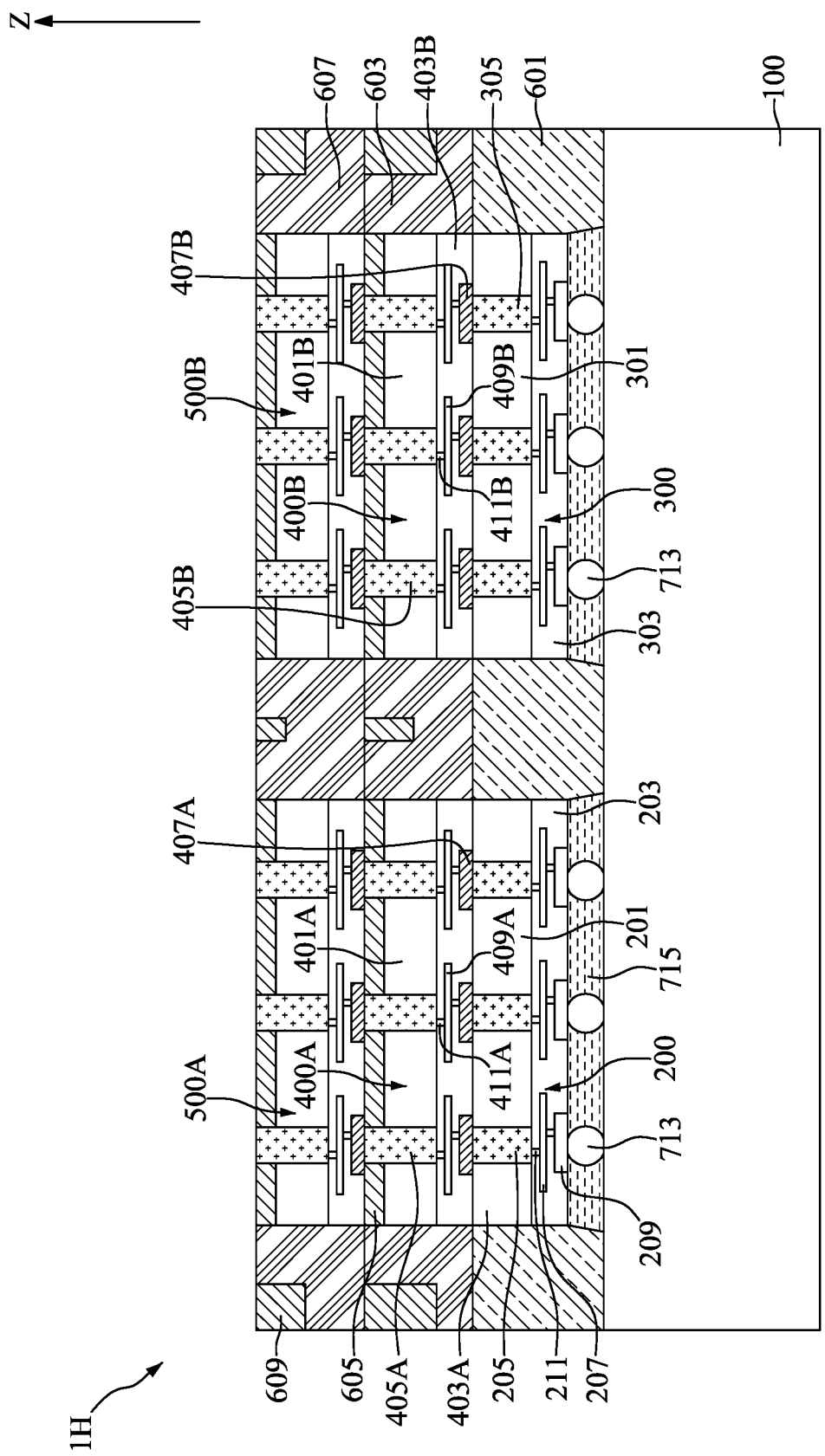

With reference to FIG. 22, the semiconductor device 1H may have a structure similar to that illustrated in FIG. 14. The same or similar elements in FIG. 22 as in FIG. 14 have been marked with similar reference numbers and duplicative descriptions have been omitted.

With reference to FIG. 22, underfill layers 715 may be respectively correspondingly disposed between the first bottom chip 200 and the bottom substrate 100 and between the second bottom chip 300 and the bottom substrate 100 to fill the space between the bottom substrate 100 and the first bottom chip 200 and the space between the bottom substrate 100 and the second bottom chip 300. The underfill layers 715 may surround a plurality of bottom connectors 713 which electrically connecting the bottom substrate 100 and the first bottom chip 200 and the second bottom chip 300. In some embodiments, the underfill layers 715 may be from by curing an underfill material which is made up of a cross-linked organic resin and low Coefficient of Thermal Expansion (CTE) inorganic particles (up to 75 wt. %). In some embodiments, the underfill material before curing may be formulated with a liquid resin such as epoxies, a hardener such as anhydride or amines, an elastomer for toughening, a catalyst for promoting cross-linking, and other additives for flow modification and adhesion.

The underfill layers 715 may tightly adhere to the bottom substrate 100, the first bottom chip 200, and the second bottom chip 300 so as to the underfill layers 715 may redistribute the stresses and strains from the CTE mismatch and mechanical shock over the entire chip area of the first bottom chip 200 and the second bottom chip 300. As a result, crack initiation and growth in the plurality of bottom connectors 713 may be either prevented or drastically reduced. In addition, the underfill layers 715 may provide protection to the plurality of bottom connectors 713 to improve mechanical integrity of the configuration of the bottom substrate 100 and first bottom chip 200 and the second bottom chip 300; therefore, the overall reliability of the configuration of the bottom substrate 100 and the first bottom chip 200 and the second bottom chip 300 may also be significantly improved. Furthermore, the underfill layers 715 may provide partial protection against moisture ingress, and other forms of contamination.

In some embodiments, the plurality of bottom connectors 713 may include a conductive material with low resistivity, such as tin, lead, silver, copper, nickel, bismuth or an alloy thereof, and may be formed by a suitable process such as evaporation, plating, ball drop, or screen printing. In some embodiments, the plurality of bottom connectors 713 may be controlled collapse chip connection (i.e., C4) bumps formed by a C4 process.

FIGS. 23 to 29 illustrate, in schematic cross-sectional view diagrams, a flow for fabricating a semiconductor device 1I in accordance with another embodiment of the present disclosure.

Figure 23:
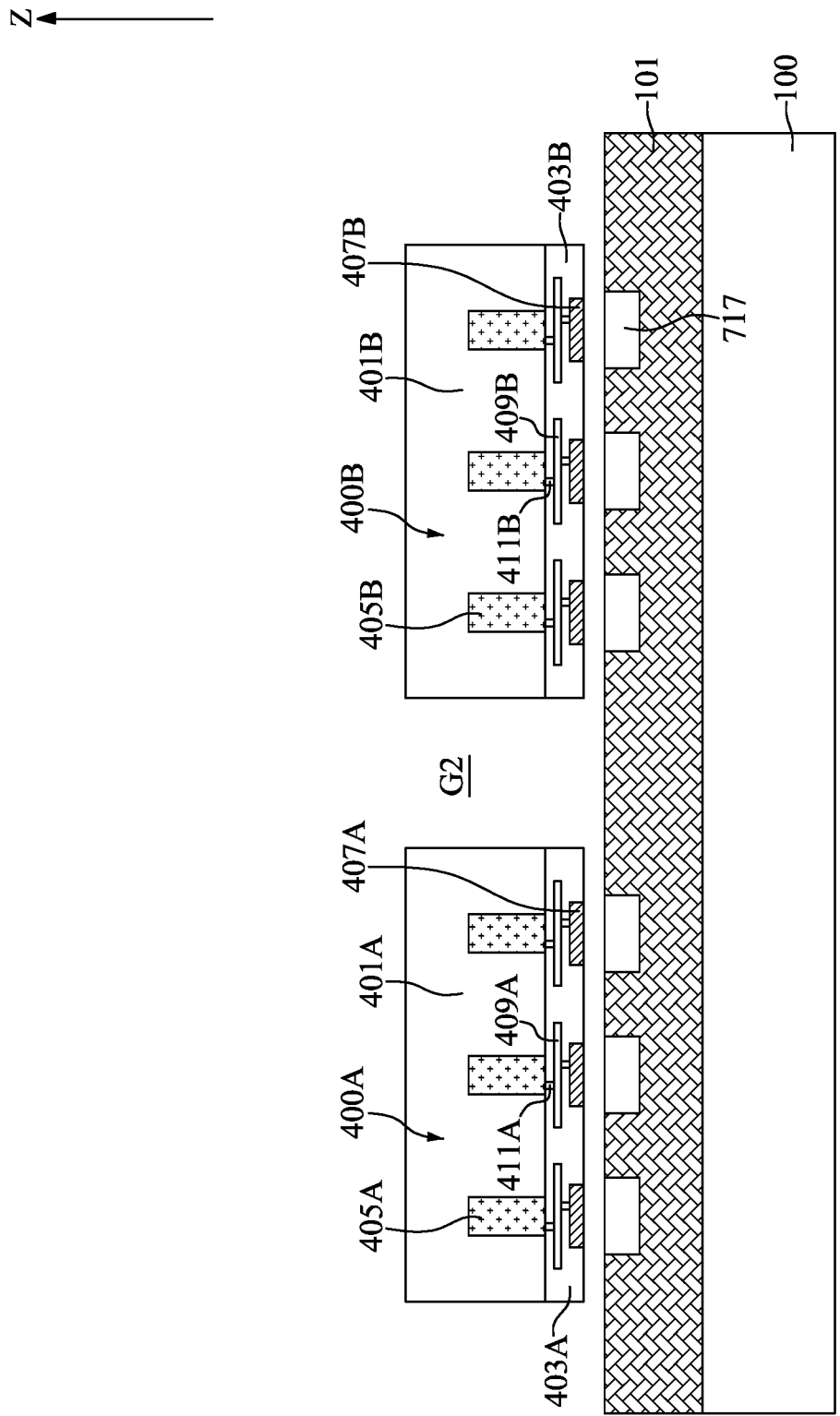
FIGS. 23 to 29 illustrate, in schematic cross-sectional view diagrams, a flow for fabricating a semiconductor device in accordance with another embodiment of the present disclosure.

With reference to FIG. 23, the bottom substrate 100 and the passivation layer 101 may respectively correspondingly have structures similar to that illustrated in FIG. 19, and descriptions thereof are not repeated herein. A plurality of conductive pads 717 may be formed in the passivation layer 101. The top surfaces of the plurality of conductive pads 717 may be substantially coplanar with the top surface of the passivation layer 101. The plurality of conductive pads 717 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 23, the first stacking chip 400A and the second stacking chip 400B may be directly bonded onto the passivation layer 101 through a hybrid bonding process similar to that illustrated in FIGS. 5 and 6, and descriptions thereof are not repeated herein.

Figure 24:
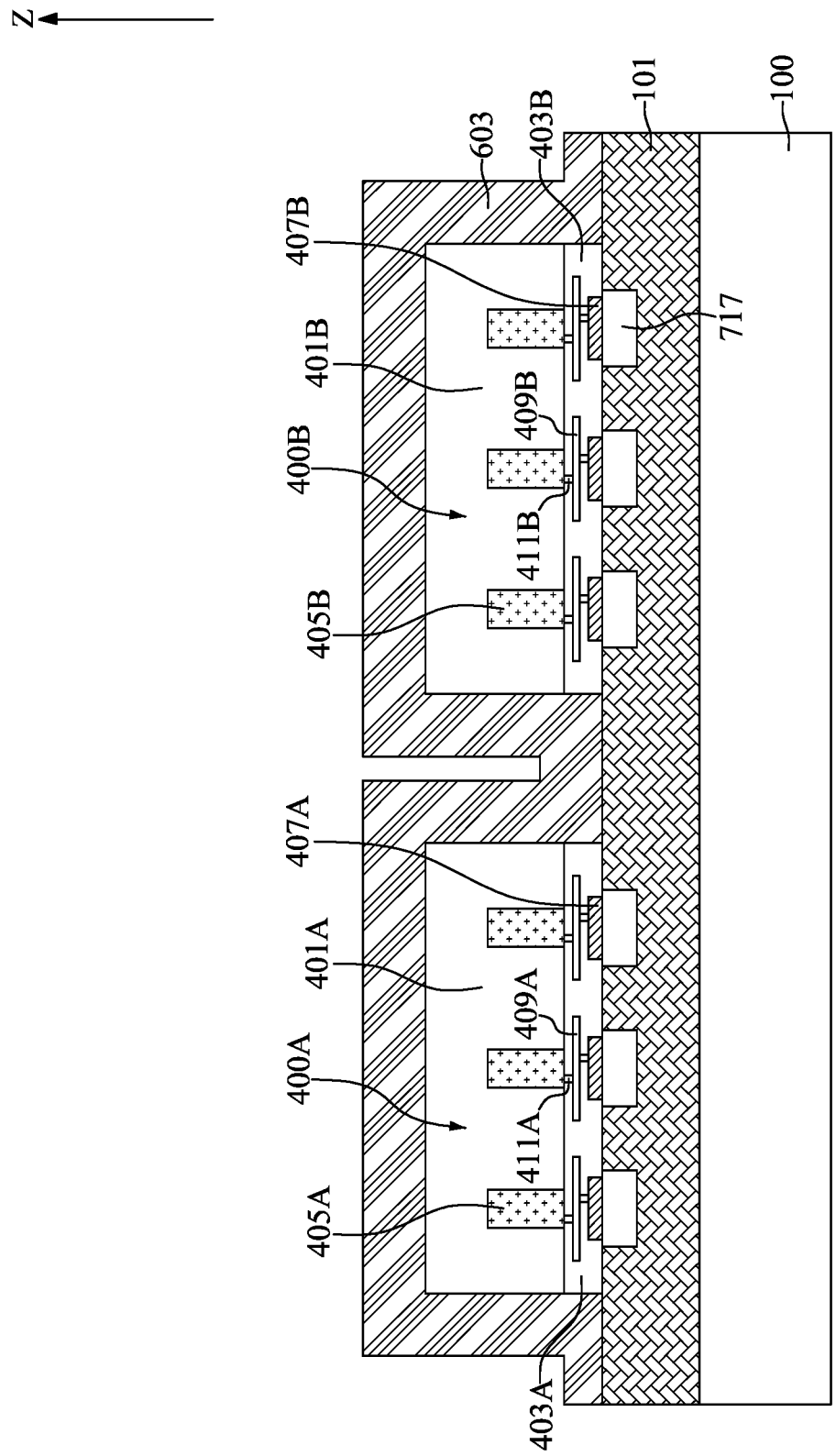

With reference to FIG. 24, the plurality of conductive pads 407A of the first stacking chip 400A and the plurality of conductive pads 407B of the second stacking chip 400B may directly contact the plurality of conductive pads 717, respectively and correspondingly. The first isolation layer 603 may be conformally formed to cover the first stacking chip 400A and the second stacking chip 400B with a procedure similar to that illustrated in FIG. 7, and descriptions thereof are not repeated herein. The second gap G2 between the first stacking chip 400A and the second stacking chip 400B may be at least partially filled by the first isolation layer 603. In some embodiments, the second gap G2 may be completely filled by the first isolation layer 603.

Figure 25:
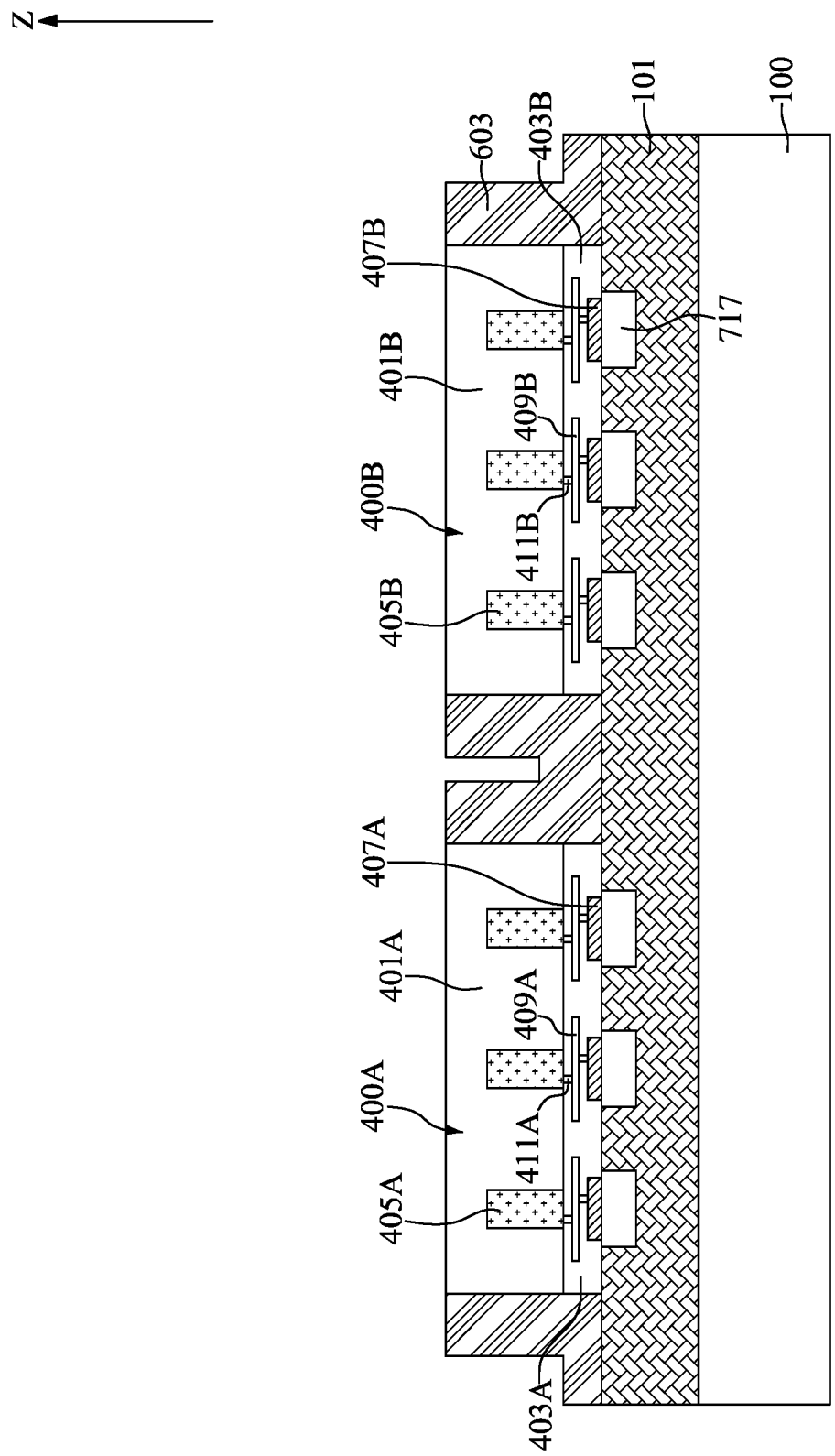

With reference to FIG. 25, the back surfaces of the first stacking chip 400A and the second stacking chip 400B may be exposed through a procedure similar to that illustrated in FIG. 8, and descriptions thereof are not repeated herein. Due to the first isolation layer 603 completely filled or partially filled the second gap G2, the back surfaces of the first stacking chip 400A and the second stacking chip 400B and the top surface of the bottom isolation layer 601 may be substantially coplanar.

In contrast, if the second gap G2 between the first stacking chip 400A and the second stacking chip 400B were not filled, the thickness uniformity may be worse, and the edge of chips may be rounding. Both phenomena may cause serious adverse impact to the following processes so as to affect the yield and quality of the fabricated semiconductor device.

Figure 26:
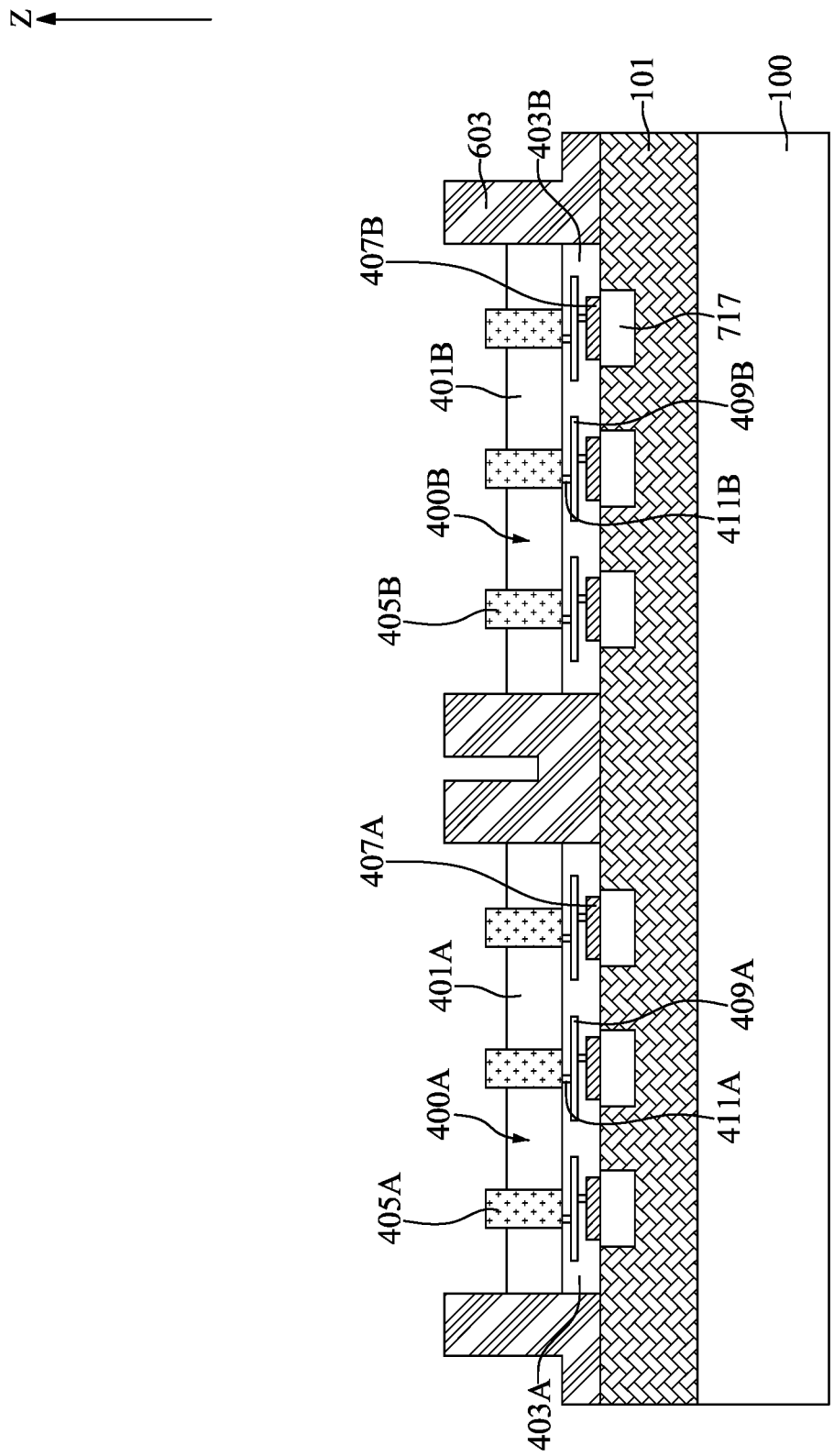

With reference to FIG. 26, a removal process may be performed to reduce the thickness of the substrate 401A, 401B and expose the plurality of through substrate vias 405A, 405B of the first stacking chip 400A and the second stacking chip 400B. The removal process may be similar to that illustrated in FIG. 9, and descriptions thereof are not repeated herein.

Figure 27:
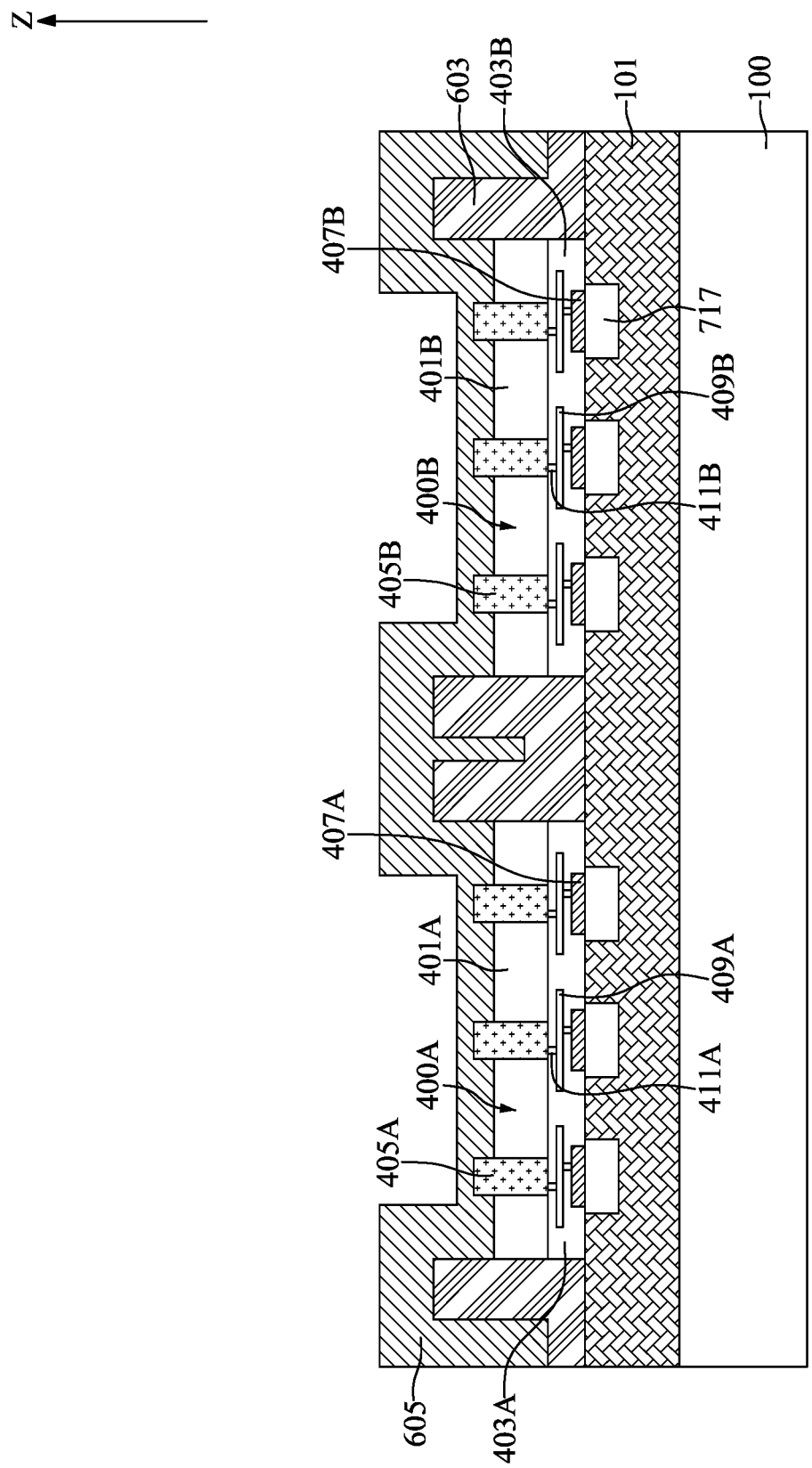

With reference to FIG. 27, the first capping layer 605 may be conformally formed to cover the first isolation layer 603, the substrate 401A, 401B, and the plurality of through substrate vias 405A, 405B with a procedure similar to that illustrated in FIG. 10, and descriptions thereof are not repeated herein.

Figure 28:
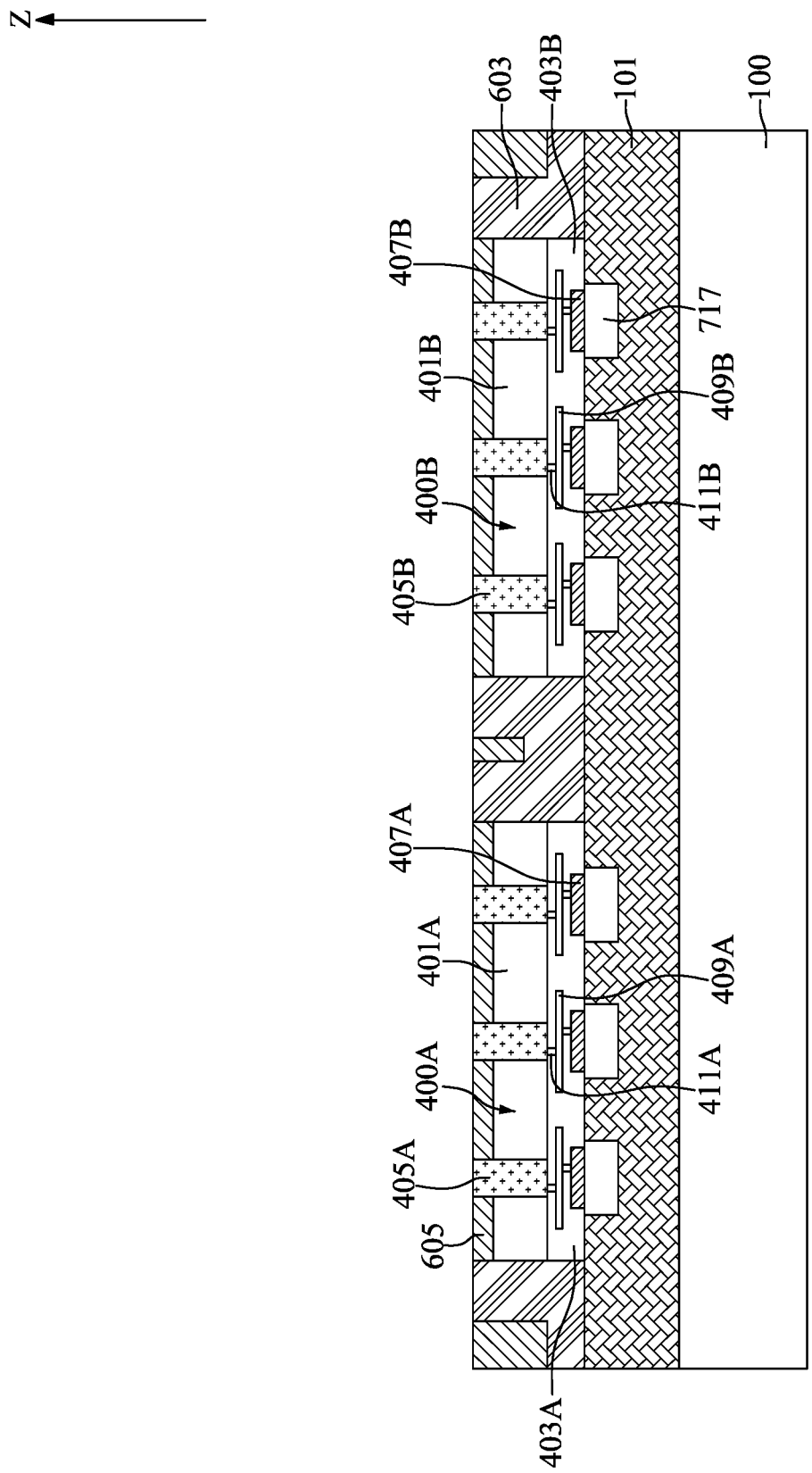

With reference to FIG. 28, a planarization process, such as chemical mechanical polishing, may be performed until the top surfaces of the plurality of through substrate vias 405A, 405B are exposed to remove excess material, provide a substantially flat surface for subsequent processing steps.

Figure 29:
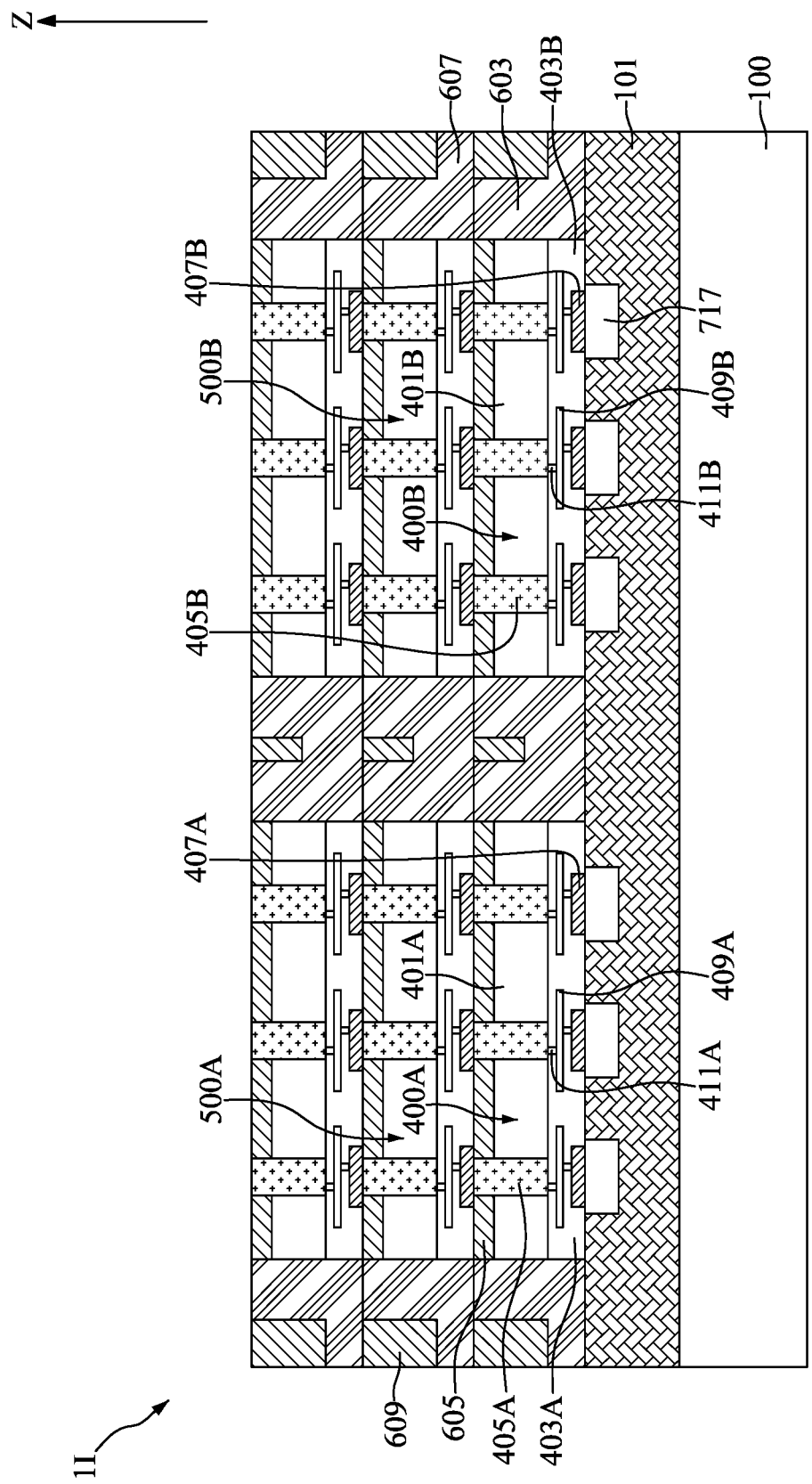

With reference to FIG. 29, the third stacking chip 500A, the fourth stacking chip 500B, and more tier of stack may be formed with a procedure similar to that illustrated in FIGS. 12 to 14, and descriptions thereof are not repeated herein.

One aspect of the present disclosure provides a method for fabricating a semiconductor device including providing a bottom substrate; bonding a first stacking chip and a second stacking chip onto the bottom substrate; conformally forming a first isolation layer to cover the first stacking chip and the second stacking chip and to at least partially fill a gap between the first stacking chip and the second stacking chip; performing a thinning process to expose back surfaces of the first stacking chip and the second stacking chip; performing a removal process to expose a through substrate via of the first stacking chip and a through substrate via of the second stacking chip; forming a first capping layer to cover the through substrate via of the first stacking chip and the through substrate via of the second stacking chip; and performing a planarization process to expose the through substrate via of the first stacking chip and a through substrate via of the second stacking chip and provide a substantially flat surface.

Another aspect of the present disclosure provides a semiconductor device including a bottom substrate; a first stacking chip and a second stacking chip positioned on the bottom substrate; a first isolation layer positioned on the bottom substrate and surrounding the first stacking chip and the second stacking chip; a first capping layer positioned on the back surface of the first stacking chip and surrounding a through substrate via of the first stacking chip. A top surface of the first isolation layer is at a vertical level higher than a vertical level of a back surface of the first stacking chip. A top surface of the through substrate via of the first stacking chip, the top surface of the first isolation layer, and a top surface of the first capping layer are substantially coplanar.

Due to the design of the semiconductor device of the present disclosure, the thickness uniformity and the edge profile of the chips may be improved. As a result, the yield, quality, and performance of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a bottom substrate;
   bonding a first stacking chip and a second stacking chip onto the bottom substrate;
   conformally forming a first isolation layer to cover the first stacking chip and the second stacking chip and to at least partially fill a gap between the first stacking chip and the second stacking chip;
   performing a thinning process to expose back surfaces of the first stacking chip and the second stacking chip;
   performing a removal process to expose a through substrate via of the first stacking chip and a through substrate via of the second stacking chip;
   forming a first capping layer to cover the through substrate via of the first stacking chip and the through substrate via of the second stacking chip; and
   performing a planarization process to expose the through substrate via of the first stacking chip and a through substrate via of the second stacking chip and provide a substantially flat surface (FIG. 11).

2. The method for fabricating the semiconductor device of claim 1, wherein the removal process is a dry etch process.

3. The method for fabricating the semiconductor device of claim 2, wherein an etch rate ratio of the first isolation layer to a substrate of the first stacking chip is between about 15:1 and about 2:1 of the dry etch process.

4. The method for fabricating the semiconductor device of claim 3, further comprising bonding a third stacking chip onto the first stacking chip and bonding a fourth stacking chip onto the second stacking chip.

5. The method for fabricating the semiconductor device of claim 4, wherein the first stacking chip and the second stacking chip are bonded onto the bottom substrate by a hybrid bonding process.

6. The method for fabricating the semiconductor device of claim 5, wherein a process pressure of the hybrid bonding process is between about 100 MPa and about 150 MPa.

7. The method for fabricating the semiconductor device of claim 6, wherein a process temperature of the hybrid bonding process is between about 25° C. and about 400° C.

8. The method for fabricating the semiconductor device of claim 7, further comprising a thermal annealing process after bonding the first stacking chip and the second stacking chip onto the bottom substrate.

9. The method for fabricating the semiconductor device of claim 8, wherein the first isolation layer comprises an oxide layer, a nitride layer, or an oxynitride layer.

10. The method for fabricating the semiconductor device of claim 9, wherein the first capping layer comprises an oxide layer, a nitride layer, or an oxynitride layer.

11. The method for fabricating the semiconductor device of claim 10, wherein the first stacking chip and the second stacking chip comprise memory circuits.

12. The method for fabricating the semiconductor device of claim 10, wherein the first stacking chip comprises logic circuits and the third stacking chip comprises memory circuits.

13. A semiconductor device, comprising:
   a bottom substrate;
   a first stacking chip and a second stacking chip positioned on the bottom substrate;
   a first isolation layer positioned on the bottom substrate and surrounding the first stacking chip and the second stacking chip, wherein a top surface of the first isolation layer is at a vertical level higher than a vertical level of a back surface of the first stacking chip;
   a first capping layer positioned on the back surface of the first stacking chip and surrounding a through substrate via (FIG. 14, 405A) of the first stacking chip, wherein a top surface of the through substrate via of the first stacking chip, the top surface of the first isolation layer, and a top surface of the first capping layer are substantially coplanar.

14. The semiconductor device of claim 13, wherein a thickness of the first stacking chip is equal to or less than about 10 nm.

15. The semiconductor device of claim 14, further comprising a third stacking chip positioned on the first stacking chip and a fourth stacking chip positioned on the second stacking chip.

16. The semiconductor device of claim 15, wherein the first stacking chip and the third stacking chip comprise memory circuits.

17. The semiconductor device of claim 15, wherein the first stacking chip comprises logic circuits and the third stacking chip comprises memory circuits.

18. The semiconductor device of claim 15, further comprising a plurality of connectors positioned on back surfaces of the third stacking chip and the fourth stacking chip.

19. The semiconductor device of claim 15, further comprising a redistribution layer positioned in the bottom substrate;
   wherein the first stacking chip and the second stacking chip are respectively electrically coupled to the redistribution layer.

20. The semiconductor device of claim 19, wherein a conductive pad of the first stacking chip directly contacts the redistribution layer.

* * * * *